United States Patent
Lee et al.

(10) Patent No.: US 12,268,074 B2
(45) Date of Patent: Apr. 1, 2025

(54) COLOR CONVERSION PANEL, METHOD OF MEASURING VOLUME OF INK LAYER THEREOF, AND DISPLAY DEVICE INCLUDING THE COLOR CONVERSION PANEL

(71) Applicant: Samsung Display Co., LTD., Yongin-si (KR)

(72) Inventors: Seon Uk Lee, Seongnam-si (KR); Ho-Yong Shin, Suwon-si (KR); Gyeongeun Eoh, Seongnam-si (KR); Dongjun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 670 days.

(21) Appl. No.: 17/405,094

(22) Filed: Aug. 18, 2021

(65) Prior Publication Data

US 2022/0165801 A1   May 26, 2022

(30) Foreign Application Priority Data

Nov. 20, 2020   (KR) .................. 10-2020-0156179

(51) Int. Cl.
  *H10K 59/38*   (2023.01)
(52) U.S. Cl.
  CPC .................... *H10K 59/38* (2023.02)
(58) Field of Classification Search
  CPC ...... H10K 59/38; H10K 59/88; H10K 59/122; G02B 5/206; G02B 5/223
  See application file for complete search history.

(56) References Cited

U.S. PATENT DOCUMENTS

| | | | | |
|---|---|---|---|---|
| 2002/0064966 A1* | 5/2002 | Seki | ..................... | H10K 71/135 438/82 |
| 2007/0052119 A1* | 3/2007 | Sakai | ................... | H10K 71/611 264/1.7 |
| 2015/0372067 A1* | 12/2015 | Kim | ..................... | H10K 59/122 438/34 |
| 2018/0315802 A1* | 11/2018 | Kamiyama | ........ | H10K 50/8426 |

FOREIGN PATENT DOCUMENTS

| KR | 1020070049172 A | 5/2007 |
|---|---|---|
| KR | 1020160017373 A | 2/2016 |
| KR | 1020190078925 A | 7/2019 |
| KR | 10-2058706 B1 | 12/2019 |

* cited by examiner

*Primary Examiner* — Kevin Quarterman
(74) *Attorney, Agent, or Firm* — CANTOR COLBURN LLP

(57) ABSTRACT

A color conversion panel includes an active area corresponding to a display area and including an active pixel portion at which light is emitted, a dummy area adjacent to the active area and including a first dummy pixel portion and a second dummy pixel portion, and a color conversion layer including a bank layer in both the active area and the dummy area. The bank layer defines each of an active opening corresponding to the active pixel portion and defining an active opening planar area, a first dummy opening corresponding to the first dummy pixel portion and defining a first planar area, and a second dummy opening corresponding to the second dummy pixel portion and defining a second planar area. The first planar area of the first dummy opening is different from the second planar area of the second dummy opening.

18 Claims, 17 Drawing Sheets

COLOR CONVERSION PANEL, METHOD OF MEASURING VOLUME OF INK LAYER THEREOF, AND DISPLAY DEVICE INCLUDING THE COLOR CONVERSION PANEL

This application claims priority to Korean Patent Application No. 10-2020-0156179 filed on Nov. 20, 2020, and all the benefits accruing therefrom under 35 U.S.C. § 119, the entire disclosure of which is incorporated by reference herein.

BACKGROUND

1. Field

Embodiments relate to a display device. More particularly, embodiments relate to a color conversion panel, a method of measuring a volume of an ink layer of the color conversion panel, and a display device including the color conversion panel.

2. Description of the Related Art

A display device may implement red, green, blue, etc. color light according to the wavelength of emitted light. A display device including a color conversion panel has been proposed in order to implement excellent color reproduction and luminance. The color conversion panel may include an ink layer including quantum dots or the like.

In order to increase light efficiency of the color conversion panel, a thickness of the ink layer may be maintained within a range. Accordingly, to maintain the thickness of the ink layer within the range, a volume of the ink layer may be measured to adjust the thickness of the ink layer.

SUMMARY

Embodiments provide a color conversion panel having improved display quality and a display device including the color conversion panel.

Embodiments provide a method of quickly and accurately measuring volume of an ink layer of the color conversion panel.

An embodiment of a color conversion panel includes a substrate including an active area including an active pixel portion and a dummy area which is adjacent to the active area and includes a first dummy pixel portion and a second dummy pixel portion, a color filter layer on the substrate, and a bank on the color filter layer and defining an active opening overlapping the active pixel portion, a first dummy opening overlapping the first dummy pixel portion, and a second dummy opening overlapping the second dummy pixel portion, a first extent of the first dummy opening being different from a second extent of the second dummy opening.

In an embodiment, the first extent may be substantially equal to an extent of the active opening.

In an embodiment, the second extent may be less than the first extent.

In an embodiment, the second extent may be greater than the first extent.

In an embodiment, each of the first extent and the second extent may be in a range from about 70% to about 130% of an extent of the active opening.

In an embodiment, the color conversion panel may further include an active ink layer, a first dummy ink layer, and a second dummy ink layer respectively filling the active opening, the first dummy opening, and the second dummy opening. A volume of the active ink layer, a volume of the first dummy ink layer, and a volume of the second dummy ink layer may be substantially equal to each other.

In an embodiment, a material of the active ink layer, a material of the first dummy ink layer, and a material of the second dummy ink layer may be substantially the same as each other.

In an embodiment, the first dummy pixel portion may be disposed in a direction from the active pixel portion, and the second dummy pixel portion may be disposed in the direction from the first dummy pixel portion.

In an embodiment, a width of the first dummy opening along a first direction may be substantially equal to a width of the second dummy opening along the first direction, and a width of the first dummy opening along a second direction crossing the first direction may be different from a width of the second dummy opening along the second direction.

In an embodiment, the dummy area may further include a third dummy pixel portion. The bank may further define a third dummy opening overlapping the third dummy pixel portion. A third extent of the third dummy opening may be different from the first extent and the second extent.

In an embodiment, the first extent may be substantially equal to an extent of the active opening.

In an embodiment, the second extent may be less than the first extent, and the third extent may be greater than the third extent.

In an embodiment, each of the first extent, the second extent, and the third extent may be in a range from about 70% to about 130% of an extent of the active opening.

In an embodiment, the dummy area may further include a fourth dummy pixel portion. The bank may further define a fourth dummy opening overlapping the fourth dummy pixel portion. A fourth extent of the fourth dummy opening may be different from the first extent, the second extent, and the third extent.

An embodiment of a method of measuring volume of an ink layer of a color conversion panel includes preparing a color conversion panel including a bank which defines an active opening overlapping an active pixel portion, a first dummy opening overlapping a first dummy pixel portion and having a first extent, and a second dummy opening overlapping a second dummy pixel portion and having a second extent different from the first extent, respectively forming an active ink layer, a first dummy ink layer, and a second dummy ink layer in the active opening, the first dummy opening, and the second dummy opening, the active ink layer, the first dummy ink layer, and the second dummy ink layer having substantially the same volume, collecting an image with respect to the active ink layer, the first dummy ink layer, and the second dummy ink layer by capturing the color conversion panel, and comparing a brightness of the active ink layer, a brightness of the first dummy ink layer, and a brightness of the second dummy ink layer of the image.

In an embodiment, the first extent may be substantially equal to an extent of the active opening. The brightness of the active ink layer of the image may be substantially equal to the brightness of the first dummy ink layer of the image.

In an embodiment, the brightness of the second dummy ink layer of the image may be different from the brightness of the first dummy ink layer of the image.

An embodiment of a display device may include a color conversion panel including an active area including an active pixel portion and a dummy area which is adjacent to the active area and includes a first dummy pixel portion and a second dummy pixel portion, a display panel providing a light to the active area of the color conversion panel, and a filling layer disposed between the color conversion panel and the display panel. The color conversion panel may include a substrate, a color filter layer on the substrate, and a bank disposed on the color filter layer and defining an active opening overlapping the active pixel portion, a first dummy opening overlapping the first dummy pixel portion, and a second dummy opening overlapping the second dummy pixel portion, a first extent of the first dummy opening being different from a second extent of the second dummy opening.

In an embodiment, the display panel may include a light emitting element overlapping the active pixel portion.

In an embodiment, each of the first extent and the second extent may be in a range from about 70% to about 130% of an extent of the active opening.

In one or more embodiment of the color conversion panel and the display device including the same, the first dummy opening and the second dummy opening, which have different extents from each other, may be provided or formed in the dummy area, so that the volume of the active ink layer provided or formed in the active opening may be easily controlled by using the dummy openings. Accordingly, the display quality of the color conversion panel and the display device including the color conversion panel may be improved.

In one or more embodiment of the method of measuring the volume of the ink layer of the color conversion panel, the ink layers having the substantially the same volume may be respectively provided or formed in the first dummy opening and the second dummy opening, which have different extents from each other, and the brightness of the ink layers may be compared, so that the volumes of the ink layers may be quickly and accurately measured.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
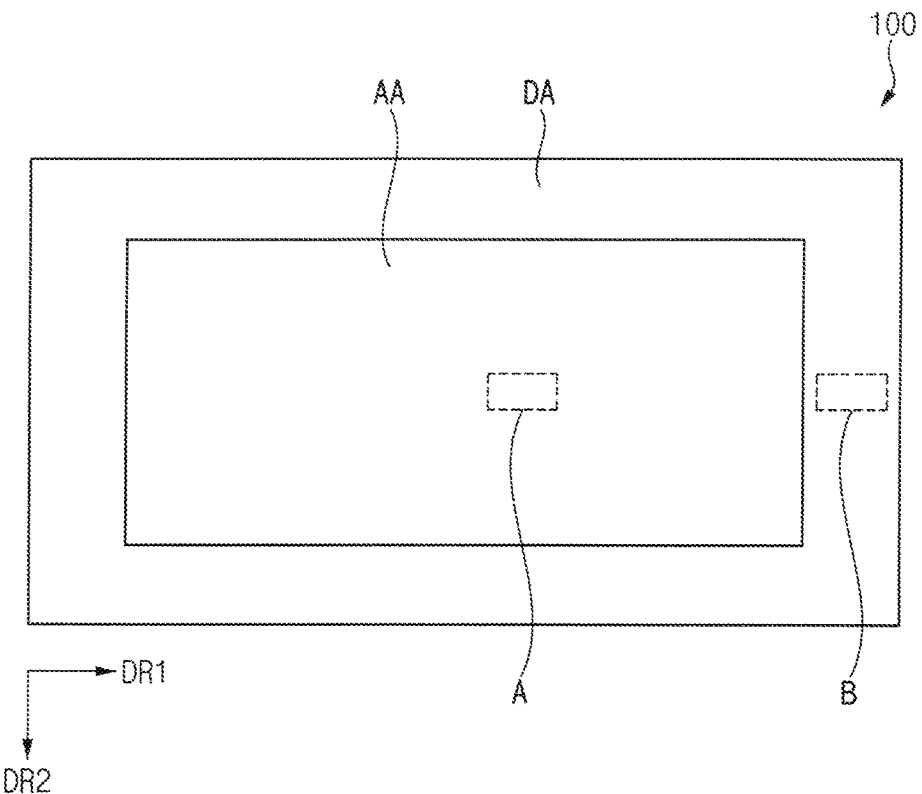
FIG. 1 is a plan view illustrating an embodiment of a color conversion panel.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, color conversion panels, methods of measuring a volume of an ink layer of color conversion panels, and display devices including the color conversion panels in accordance with embodiments will be explained in detail with reference to the accompanying drawings.

Figure 2:
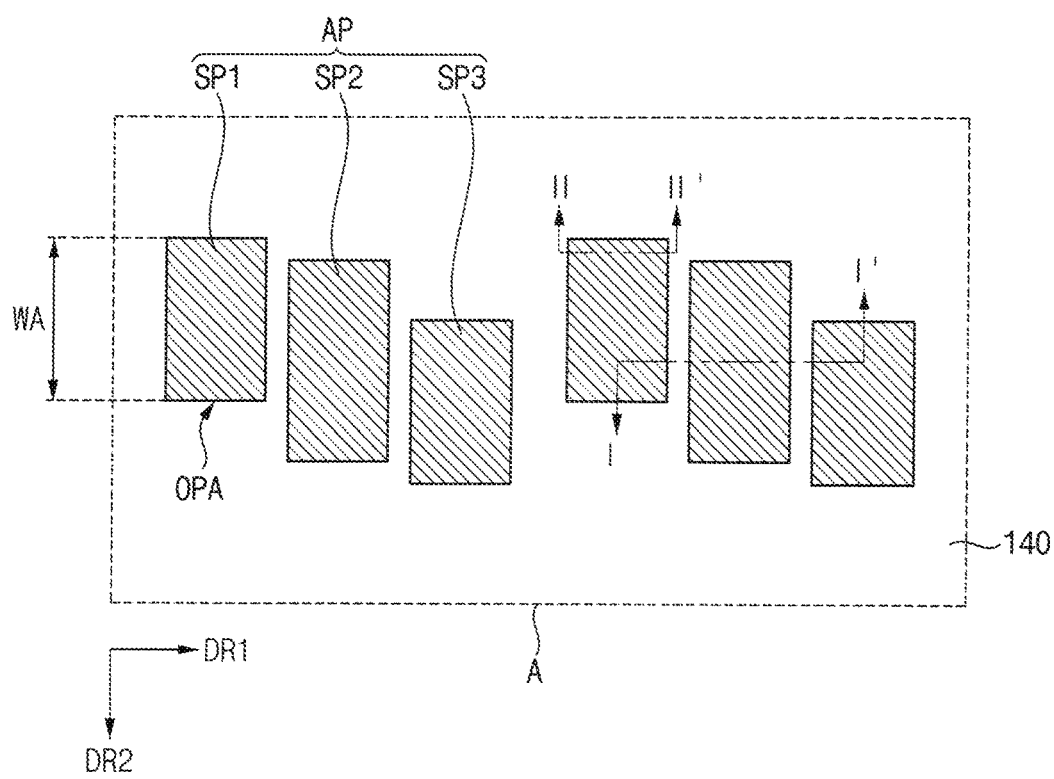
FIG. 2 is an enlarged plan view illustrating an embodiment of area A in FIG. 1.
Figure 3:
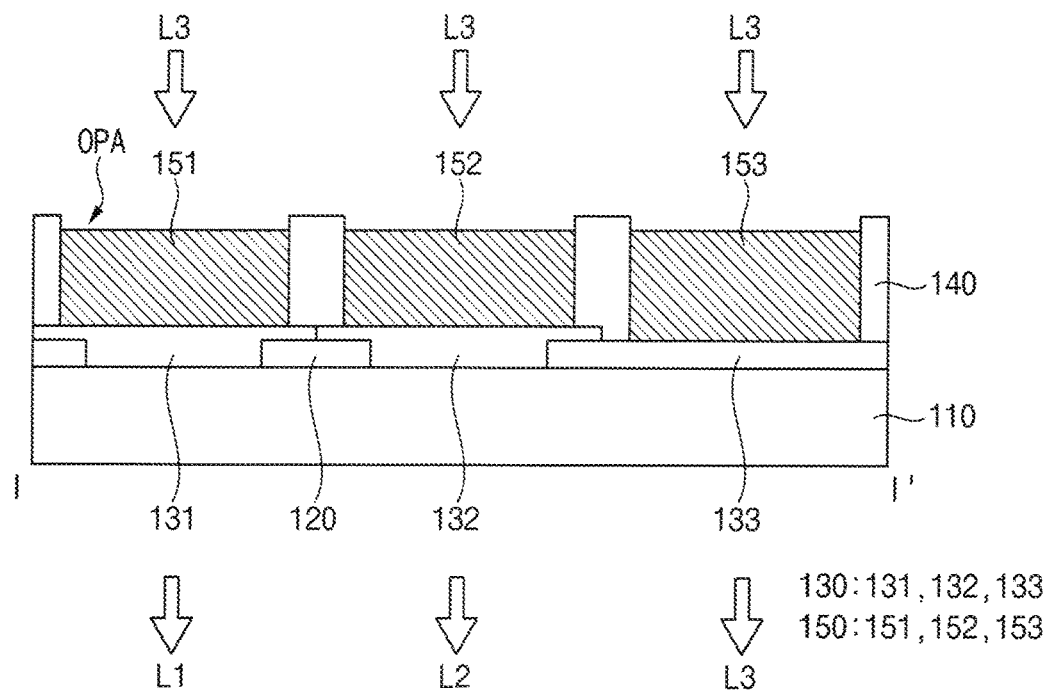
FIG. 3 is a cross-sectional view illustrating the color conversion panel taken along line I-I' in FIG. 2.

FIG. 1 is a plan view illustrating an embodiment of a color conversion panel 100. FIG. 2 is an enlarged plan view illustrating an embodiment of area A in FIG. 1. FIG. 3 is a cross-sectional view illustrating the color conversion panel 100 taken along line I-I' in FIG. 2.

Referring to FIGS. 1, 2, and 3, a color conversion panel 100 may include a substrate 110, a black matrix 120, a color filter layer 130, a bank 140 (e.g., bank layer), and an active ink layer 150.

The substrate 110 may include an active area AA and a dummy area DA. The active area AA may be a display area that displays an image, in which an image is generated, in which a light is generated and/or emitted, etc. The active area AA may correspond to a display area of a display device 1000 and the dummy area DA may be outside the active area AA and correspond to a non-display area of the display device 1000.

The dummy area DA may be adjacent to the active area AA. In an embodiment, the dummy area DA may surround the active area AA. The dummy area DA may be a non-display area that does not display an image, in which an image is not generated, in which a light is not generated and/or not emitted, etc. The color conversion panel 100 and various layers or components thereof may include the dummy area DA and the active area AA described above for the substrate 110.

The active area AA may include an active pixel portion AP which is provided in plurality including active pixel portions AP. The active pixel portions AP may be arranged in a substantially matrix form along a first direction DR1 and a second direction DR2 which crosses the first direction DR1. The first direction DR1 may be one of a row direction and a column direction, and the second direction DR2 may be the other one of the row direction and the column direction. A thickness of the color conversion panel 100 and various layers or components thereof may be taken along a third direction crossing each of the first direction DR1 and the second direction DR2.

Each of the active pixel portions AP may include a first sub-pixel portion SP1, a second sub-pixel portion SP2, and a third sub-pixel portion SP3. The first sub-pixel portion SP1, the second sub-pixel portion SP2, and the third sub-pixel portion SP3 may emit light of different colors. The first sub-pixel portion SP1 may emit first light L1 having a first color, the second sub-pixel portion SP2 may emit second light L2 having a second color, and the third sub-pixel portion SP3 may emit third light L3 having a third color. In an embodiment, the first color may be red, the second color may be green, and the third color may be blue. The active pixel portion AP may emit light of various colors that combines the first light L1 emitted from the first sub-pixel portion SP1, the second light L2 emitted from the second sub-pixel portion SP2, and the third light L3 emitted from the third sub-pixel portion SP3.

The black matrix 120 may be disposed on the substrate 110. The black matrix 120 may block or reflect light incident thereon. The black matrix 120 may reduce or effectively prevent a color mixture between the first light L1 emitted from the first sub-pixel portion SP1, the second light L2 emitted from the second sub-pixel portion SP2, and the third light L3 emitted from the third sub-pixel portion SP3.

The color filter layer 130 may be disposed on the black matrix 120. The color filter layer 130 may cover the black matrix 120 on the substrate 110. The color filter layer 130 may include a first color filter 131, a second color filter 132, and a third color filter 133.

The first color filter 131 may transmit the first light L1 having the first color, and may block light other than the first light L1. Accordingly, the first color filter 131 may improve the color purity of the first light L1 emitted from the first sub-pixel portion SP1.

The second color filter 132 may transmit the second light L2 having the second color, and may block light other than the second light L2. Accordingly, the second color filter 132 may improve the color purity of the second light L2 emitted from the second sub-pixel portion SP2.

The third color filter 133 may transmit the third light L3 having the third color, and may block light other than the third light L3. Accordingly, the third color filter 133 may improve the color purity of the third light L3 emitted from the third sub-pixel portion SP3. In an embodiment, a material of the third color filter 133 may be substantially the same as a material of the black matrix 120. In such an embodiment, the third color filter 133 and the black matrix 120 may be substantially simultaneously provided or formed in a method of providing the color conversion panel 100.

The bank 140 may be disposed on the color filter layer 130. The bank 140 may block or reflect light incident thereon. The bank 140 may reduce or effectively prevent a color mixture between the first light L1 emitted from the first sub-pixel portion SP1, the second light L2 emitted from the second sub-pixel portion SP2, and the third light L3 emitted from the third sub-pixel portion SP3.

The bank 140 may define an active opening OPA which is provided in plural including a plurality of active openings OPA overlapping or corresponding to the active pixel portions AP. The active pixel portion AP including the first sub-pixel portion SP1, the second sub-pixel portion SP2, and the third sub-pixel portion SP3 may be respectively defined by the active opening OPA.

In an embodiment, a shape, a planar area, dimensions, etc. (e.g., extents) of the active openings OPA respectively overlapping the sub-pixel portions that emit light having the same color may be substantially equal to each other. In an embodiment, for example, extents of the active openings OPA respectively overlapping the first sub-pixel portions SP1 of the active pixel portions AP may be substantially equal to each other, extents of the active openings OPA respectively overlapping the second sub-pixel portions SP2 of the active pixel portions AP may be substantially equal to each other, and extents of the active openings OPA respectively overlapping the third sub-pixel portions SP3 of the active pixel portions AP may be substantially equal to each other.

The active ink layer 150 may fill the active opening OPA. The active ink layer 150 may convert (e.g., wavelength-convert or color-convert) light or transmit light incident thereon (e.g., without wavelength or color conversion).

The active ink layer 150 may include a first active ink layer 151 (e.g., first active ink pattern), a second active ink layer 152 (e.g., second active ink pattern), and a third active ink layer 153 (e.g., third active ink pattern). The first active ink layer 151 may fill the active opening OPA that defines or corresponds to the first sub-pixel portion SP1, the second active ink layer 152 may fill the active opening OPA that defines or corresponds to the second sub-pixel portion SP2, and the third active ink layer 153 may fill the active opening OPA that defines or corresponds to the third sub-pixel portion SP3. In other words, the first active ink layer 151 may be disposed on the first color filter 131, the second active ink layer 152 may be disposed on the second color filter 132, and the third active ink layer 153 may be disposed on the third color filter 133.

The first active ink layer 151 may convert the third light L3 incident thereon (e.g., incident light) into the first light L1. In an embodiment, the first active ink layer 151 may include a first quantum dot and a first scatterer. The first quantum dot may be a particulate material that emits a specific color while electrons transition from a conduction band to a valence band. The first quantum dot may convert the third light L3 into the first light L1. The first scatterer may scatter light incident within the first active ink layer 151 in an arbitrary direction irrespective of an incident direction of the light. In an embodiment, for example, the first scatterer may include metal oxide particles, organic particles, or the like.

The second active ink layer 152 may convert the third light L3 incident thereon into the second light L2. In an embodiment, the second active ink layer 152 may include a second quantum dot and a second scatterer. The second quantum dot may be a particulate material that emits a specific color while electrons transition from a conduction band to a valence band. The second quantum dot may convert the third light L3 into the second light L2. The second scatterer may scatter light incident within the second active ink layer 152 in an arbitrary direction irrespective of an incident direction of the light. In an embodiment, for example, the second scatterer may be substantially the same as the first scatterer.

The third active ink layer 153 may transmit the third light L3 incident thereon without conversion thereof. In an embodiment, the third active ink layer 153 may include a third scatterer. The third scatterer may scatter light incident within the third active ink layer 153 in an arbitrary direction irrespective of an incident direction of the light. In an embodiment, for example, the third scatterer may be substantially the same as the first scatterer and the second scatterer.

Figure 4:
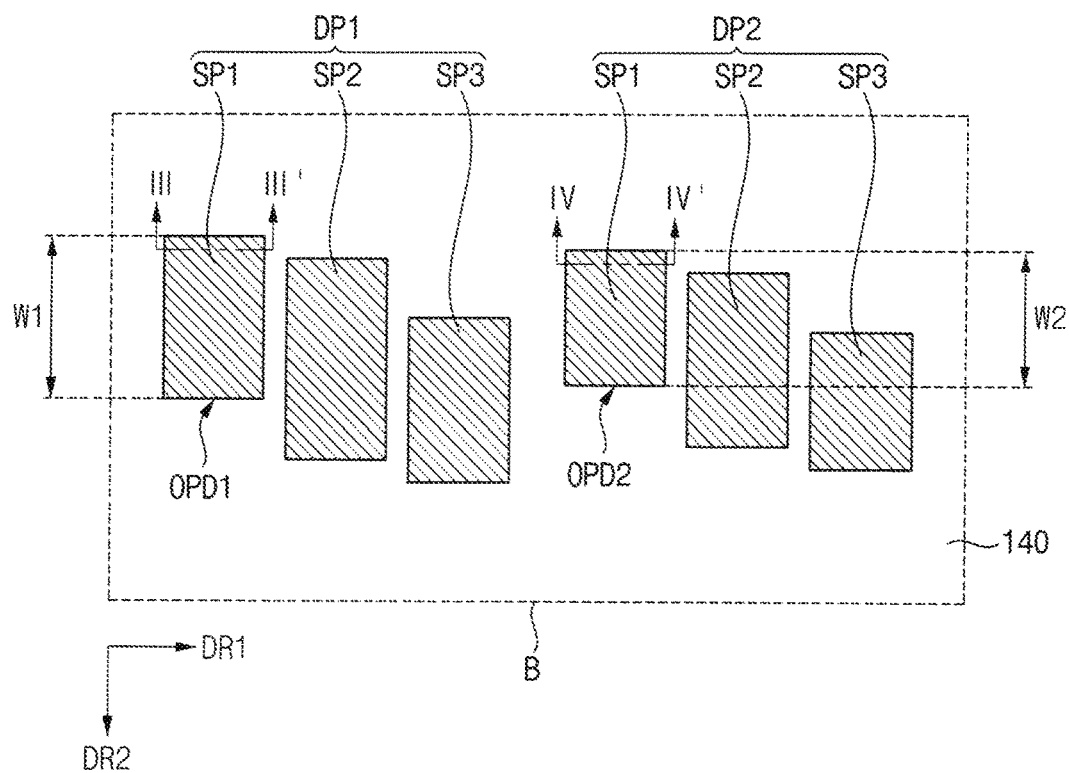
FIG. 4 is an enlarged plan view illustrating an embodiment of area B in FIG. 1.
Figure 5:
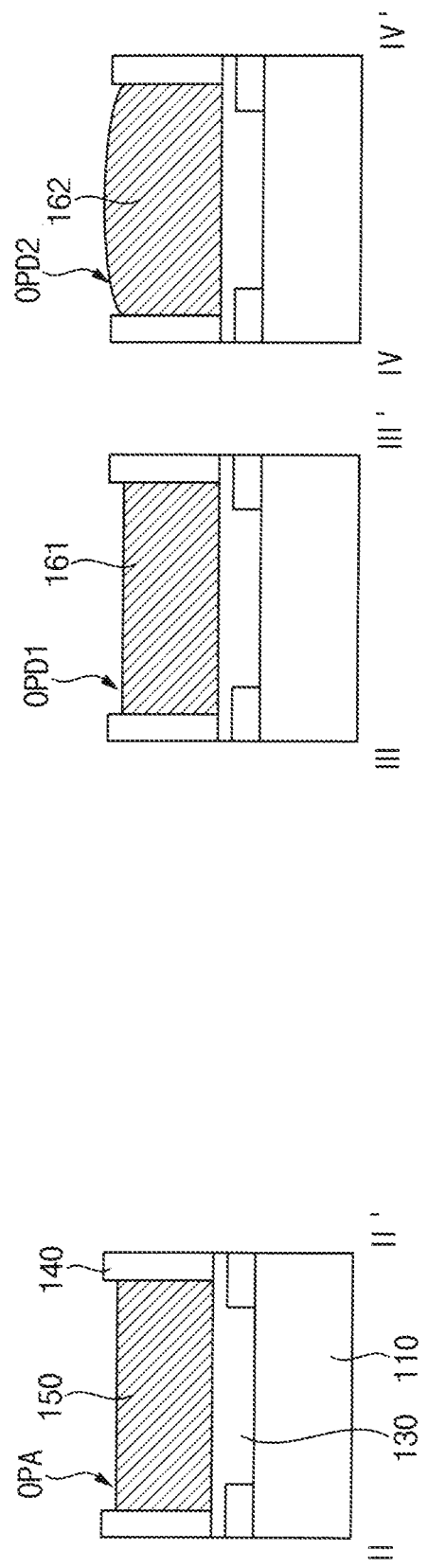
FIG. 5 is a cross-sectional view illustrating the color conversion panel taken along line II-II' in FIG. 2 and lines III-III' and IV-IV' in FIG. 4.

FIG. 4 is an enlarged plan view illustrating an embodiment area B in FIG. 1. FIG. 5 is a cross-sectional view illustrating the color conversion panel 100 taken along line II-II' in FIG. 2 and lines III-III' and IV-IV' in FIG. 4.

Referring to FIGS. 1, 2, 4, and 5, the color conversion panel 100 may further include a first dummy ink layer 161 and a second dummy ink layer 162. The active ink layer 150, the first dummy ink layer 161 and a second dummy ink layer 162 may be in a same layer as each other among layers on the substrate 110, and collectively define an ink layer of the color conversion panel 100. The ink layer may be in a same layer as the bank layer. The ink layer together with the bank layer may define a color conversion layer of the color conversion panel 100. The color conversion layer may include a bank layer and the ink layer in both the active area AA and the dummy area DA.

The dummy area DA may include a first dummy pixel portion DP1 provided in plural including first dummy pixel portions DP1 and a second dummy pixel portion provided in plural including second dummy pixel portions DP2. The first dummy pixel portions DP1 may be disposed adjacent to the active pixel portions AP along the first direction DR1, and may be arranged spaced apart from each other along the second direction DR2. The second dummy pixel portions DP2 may be disposed adjacent to the first dummy pixel portions DP1 along the first direction DR1, and may be arranged spaced apart from each other along the second direction DR2. That is, the active pixel portion AP, the first dummy pixel portion DP1 and the second dummy pixel portion DP2 may be in order along the first direction DR1 from the active area AA.

The first dummy pixel portion DP1 may include a first sub-pixel portion SP1, a second sub-pixel portion SP2, and a third sub-pixel portion SP3. Shapes and arrangements of the first sub-pixel portion SP1, the second sub-pixel portion SP2, and the third sub-pixel portion SP3 of the first dummy pixel portion DP1 may be substantially the same as or similar to shapes and arrangements of the first sub-pixel portion SP1, the second sub-pixel portion SP2, and the third sub-pixel portion SP3 of the active pixel portion AP.

The second dummy pixel portion DP2 may include a first sub-pixel portion SP1, a second sub-pixel portion SP2, and a third sub-pixel portion SP3. Shapes and arrangements of the first sub-pixel portion SP1, the second sub-pixel portion SP2, and the third sub-pixel portion SP3 of the second dummy pixel portion DP2 may be substantially the same as or similar to the shapes and arrangements of the first sub-pixel portion SP1, the second sub-pixel portion SP2, and the third sub-pixel portion SP3 of the active pixel portion AP.

Hereinafter, the active pixel portion AP, the first dummy pixel portion DP1, and the second dummy pixel portion DP2 may mean corresponding sub-pixel portions displaying the same color. In an embodiment, for example, as illustrated in FIGS. 2, 4, and 5, the active pixel portion AP, the first dummy pixel portion DP1, and the second dummy pixel portion DP2 may mean (e.g., be defined by) the first sub-pixel portions SP1. However, the invention is not limited thereto, and the active pixel portion AP, the first dummy pixel portion DP1, and the second dummy pixel portion DP2 may mean the second sub-pixel portions SP2, or may mean the third sub-pixel portions SP3.

The bank 140 may further define a first dummy opening OPD1 overlapping or corresponding to the first dummy pixel portion DP1 and a second dummy opening OPD2 overlapping or corresponding to the second dummy pixel portion DP2. The first dummy pixel portion DP1 including the first sub-pixel portion SP1, the second sub-pixel portion SP2, and the third sub-pixel portion SP3 may be defined by one or more of the first dummy opening OPD1, and the second dummy pixel portion DP2 including the first sub-pixel portion SP1, the second sub-pixel portion SP2, and the third sub-pixel portion SP3 may be defined by one or more of the second dummy opening OPD2.

A respective opening may have dimensions such as a width along the first direction DR1 and a width along the second direction DR2, and a product of the widths may define a planar area of the respective opening. A first extent (e.g., first planar area) of the first dummy opening OPD1 may be different from a second extent (e.g., second planar area) of the second dummy opening OPD2. For corresponding sub-pixel portions among the first dummy pixel portion DP1 and the second dummy pixel portion DP2, a first extent (e.g., first planar area) of the first dummy opening OPD1 may be different from a second extent (e.g., second planar area) of the second dummy opening OPD2.

In an embodiment, a width of the first dummy opening OPD1 along the first direction DR1 may be substantially equal to a width of the second dummy opening OPD2 along the first direction DR1, and a first dummy width W1 of the first dummy opening OPD1 along the second direction DR2 may be different from a second dummy width W2 of the second dummy opening OPD2 along the second direction DR2. That is, for corresponding sub-pixel portions among the first dummy pixel portion DP1 and the second dummy pixel portion DP2, a first planar area of the first dummy opening OPD1 may be different from a second planar area of the second dummy opening OPD2.

The first extent of the first dummy opening OPD1 may be substantially equal to an extent (e.g., active opening planar area) of the active opening OPA. In an embodiment, the width of the first dummy opening OPD1 along the first direction DR1 may be substantially equal to a width of the active opening OPA along the first direction DR1, and the first dummy width W1 of the first dummy opening OPD1 along the second direction DR2 may be substantially equal to an active opening width WA of the active opening OPA along the second direction DR2. That is, for corresponding sub-pixel portions among the active pixel portion AP, the first dummy pixel portion DP1 and the second dummy pixel portion DP2, the first planar area of the first dummy opening OPD1 may be equal to an active opening planar area of the active opening OPA.

In an embodiment, as illustrated in FIG. 4, the second extent of the second dummy opening OPD2 may be less than the first extent of the first dummy opening OPD1. In other words, the second extent of the second dummy opening OPD2 may be less than the extent of the active opening OPA. In an embodiment, for example, the width of the second dummy opening OPD2 along the first direction DR1 may be substantially equal to the width of the first dummy opening OPD1 along the first direction DR1, and the second dummy width W2 of the second dummy opening OPD2 along the second direction DR2 may be less than the first dummy width W1 of the first dummy opening OPD1 along the second direction DR2. That is, for corresponding sub-pixel portions among the first dummy pixel portion DP1 and the second dummy pixel portion DP2, the second planar area of the second dummy opening OPD2 may be less than the first planar area of the first dummy opening OPD1. However, the invention is not limited thereto, and in an embodiment, the second extent of the second dummy opening OPD2 may be greater than the first extent of the first dummy opening OPD1. In other words, the second extent of the second dummy opening OPD2 may be greater than the extent of the active opening OPA. Hereinafter, it will be described that the second extent of the second dummy opening OPD2 is less than the first extent of the first dummy opening OPD1.

In an embodiment, each of the first extent of the first dummy opening OPD1 and the second extent of the second dummy opening OPD2 may be in a range from about 70% to about 130% of the extent of the active opening OPA. When each of the first extent and the second extent is less than about 70% of the extent of the active opening OPA, an ink layer filling the dummy openings OPD1 and OPD2 may overflow to the outside of the dummy openings OPD1 and OPD2. Further, when each of the first extent and the second extent is greater than about 130% of the extent of the active opening OPA, an ink layer filling the dummy openings OPD1 and OPD2 may not sufficiently fill the dummy openings OPD1 and OPD2, and thus, impurities may flow into the dummy openings OPD1 and OPD2. In an embodiment, the first extent of the first dummy opening OPD1 may be about 100% of the extent of the active opening OPA, and the second extent of the second dummy opening OPD2 may be about 95% of the extent of the active opening OPA. That is, for corresponding sub-pixel portions among the active pixel portion AP, the first dummy pixel portion DP1 and the second dummy pixel portion DP2, the first planar area of the first dummy opening OPD1 may be about 100% of the active opening planar area of the active opening OPA, and the second planar area of the second dummy opening OPD2 may be about 95% of the active opening planar area of the active opening OPA.

The first dummy ink layer 161 may fill the first dummy opening OPD1, and the second dummy ink layer 162 may fill the second dummy opening OPD2. Light may not be incident on the first dummy ink layer 161 and the second dummy ink layer 162.

Each of the active ink layer 150, the first dummy ink layer 161 and the second dummy ink layer 162 defines a volume. In an embodiment, a volume of the active ink layer 150, a volume of the first dummy ink layer 161, and a volume of the second dummy ink layer 162 may be substantially equal to each other. In an embodiment, for example, when the first extent of the first dummy opening OPD1 is substantially equal to the extent of the active opening OPA and the second extent of the second dummy opening OPD2 is less than the first extent of the first dummy opening OPD1, each of an upper surface of the active ink layer 150 and an upper surface of the first dummy ink layer 161 may be substantially flat, and an upper surface of the second dummy ink layer 162 may be convex. A respective ink pattern or layer may include an upper surface which is furthest from the substrate 110.

In an embodiment, a material of the active ink layer 150, a material of the first dummy ink layer 161, and a material of the second dummy ink layer 162 may be substantially the same as each other. In an embodiment, for example, each of the active ink layer 150, the first dummy ink layer 161, and the second dummy ink layer 162 may include the first quantum dot and the first scatterer. However, the invention is not limited thereto, and each of the active ink layer 150, the first dummy ink layer 161, and the second dummy ink layer 162 may include the second quantum dot and the second scatterer, or may include the third scatterer.

Figure 6:
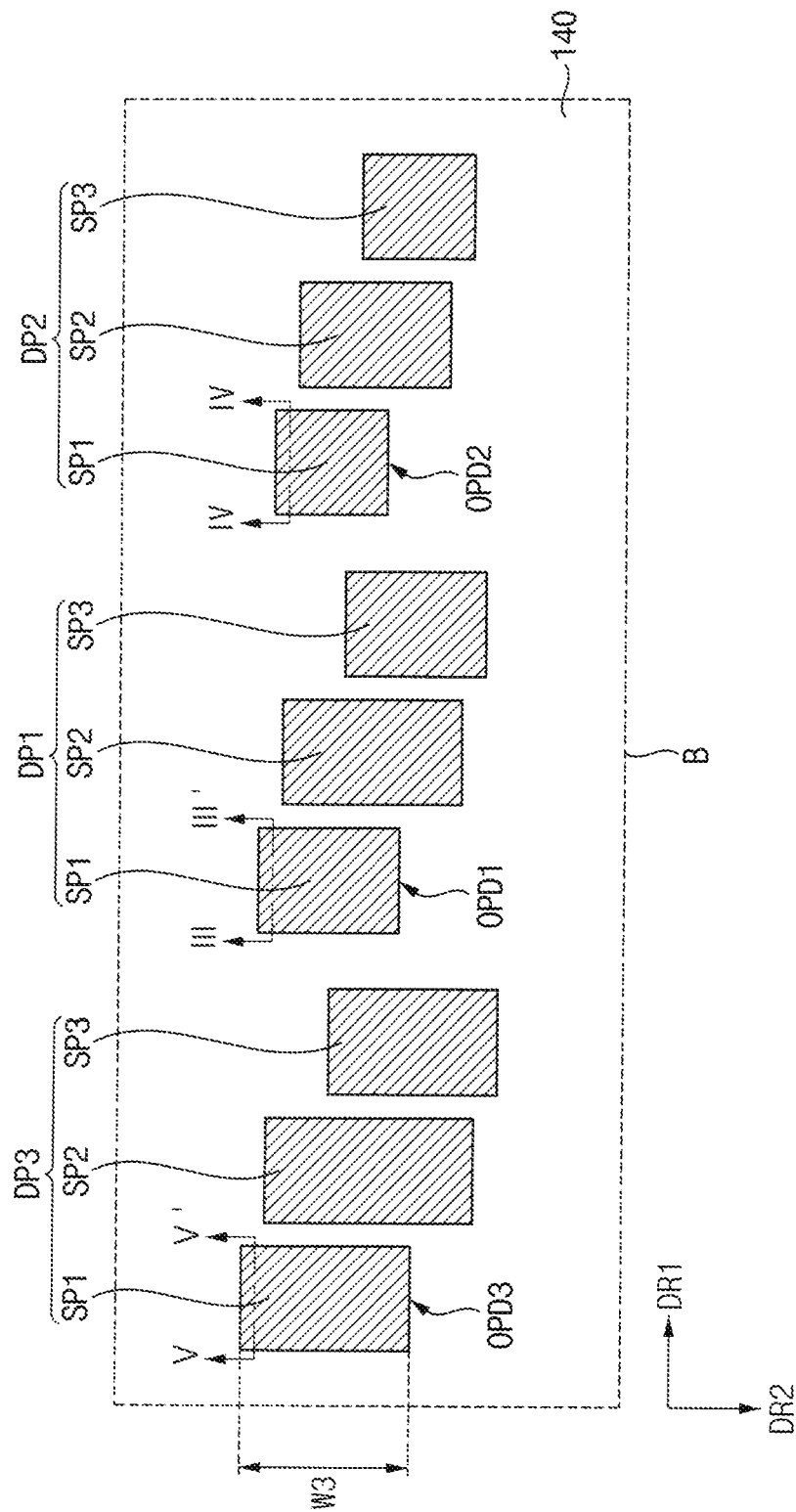
FIG. 6 is an enlarged plan view illustrating an embodiment of area B in FIG. 1.
Figure 7:
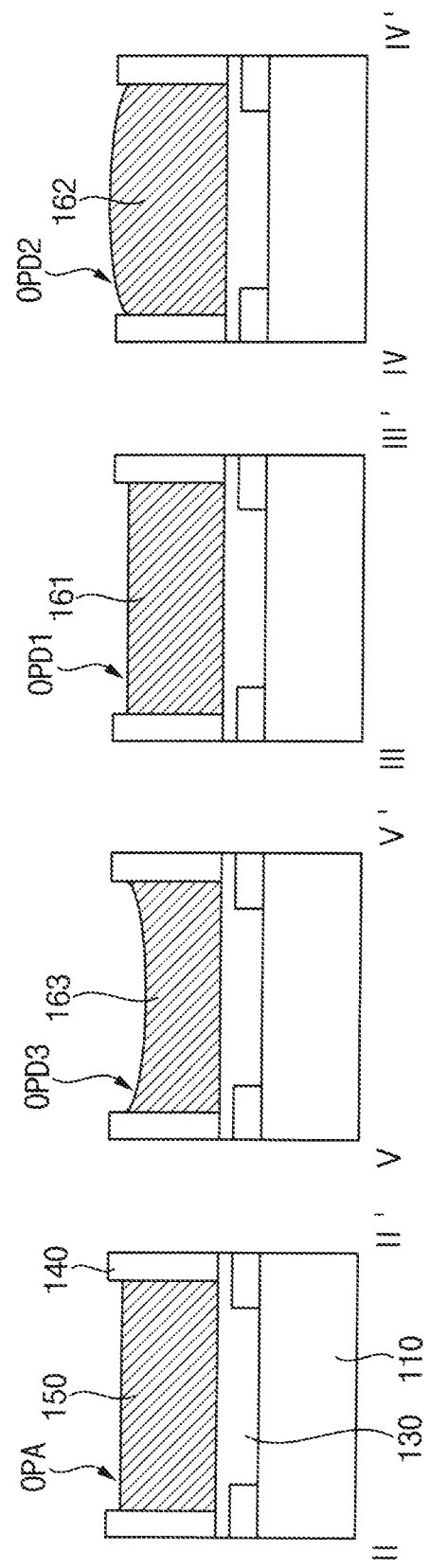
FIG. 7 is a cross-sectional view illustrating the color conversion panel taken along line II-II' in FIG. 2 and lines III-III', IV-IV', and V-V' in FIG. 6.

FIG. 6 is an enlarged plan view illustrating an embodiment of area B in FIG. 1. FIG. 7 is a cross-sectional view illustrating the color conversion panel 100 taken along line II-II' in FIG. 2 and lines III-III', IV-IV', and V-V' in FIG. 6.

A color conversion panel 100 described with reference to FIGS. 1, 2, 6, and 7 may be substantially the same as or similar to the color conversion panel 100 described with reference to FIGS. 1, 2, 4, and 5 except for the addition of a third dummy pixel portion DP3. Accordingly, descriptions on repeated elements will be omitted.

Referring to FIGS. 1, 2, 6, and 7, the color conversion panel 100 may further include a third dummy ink layer 163.

The dummy area DA may further include a third dummy pixel portion DP3 provided in plural including third dummy pixel portions DP3. The third dummy pixel portions DP3 may be disposed between the active pixel portions AP and the first dummy pixel portions DP1 along the first direction DR1, and may be arranged along the second direction DR2. That is, within the dummy area DA, the third dummy pixel portion DP3, the first dummy pixel portion DP1 and the second dummy pixel portion DP2 may be in order along the first direction DR1 from the active area AA.

The third dummy pixel portion DP3 may include a first sub-pixel portion SP1, a second sub-pixel portion SP2, and a third sub-pixel portion SP3. Shapes and arrangements of the first sub-pixel portion SP1, the second sub-pixel portion SP2, and the third sub-pixel portion SP3 of the third dummy pixel portion DP3 may be substantially the same as or similar to the shapes and arrangements of the first sub-pixel portion SP1, the second sub-pixel portion SP2, and the third sub-pixel portion SP3 of the active pixel portion AP.

Hereinafter, the active pixel portion AP, the first dummy pixel portion DP1, the second dummy pixel portion DP2, and the third dummy pixel portion DP3 may mean corresponding sub-pixel portions displaying the same color. In an embodiment, for example, as illustrated in FIGS. 2, 6, and 7, the active pixel portion AP, the first dummy pixel portion DP1, the second dummy pixel portion DP2, and the third dummy pixel portion DP3 may mean the first sub-pixel portions SP1. However, the invention is not limited thereto, and the active pixel portion AP, the first dummy pixel portion DP1, the second dummy pixel portion DP2, and the third dummy pixel portion DP3 may mean the second sub-pixel portions SP2 or the third sub-pixel portions SP3.

The bank 140 may further define a third dummy opening OPD3 overlapping the third dummy pixel portion DP3. The third dummy pixel portion DP3 including the first sub-pixel portion SP1, the second sub-pixel portion SP2, and the third sub-pixel portion SP3 may be defined by one or more of the third dummy opening OPD3.

A third extent (e.g., third planar area) of the third dummy opening OPD3 may be different from the first extent of the first dummy opening OPD1 and the second extent of the second dummy opening OPD2. In an embodiment, a width of the third dummy opening OPD3 along the first direction DR1 may be substantially the same as the width of the first dummy opening OPD1 and the width of the second dummy opening OPD2 along the first direction DR1, and a third dummy width W3 of the third dummy opening OPD3 along the second direction DR2 may be different from the first dummy width W1 of the first dummy opening OPD1 along the second direction DR2 and the second dummy width W2 of the second dummy opening OPD2 along the second direction DR2.

In an embodiment, the second extent of the second dummy opening OPD2 may be less than the first extent of the first dummy opening OPD1, and the third extent of the third dummy opening OPD3 may be greater than the first extent of the first dummy opening OPD1. In other words, the second extent of the second dummy opening OPD2 may be less than the extent of the active opening OPA, and the third extent of the third dummy opening OPD3 may be greater than the extent of the active opening OPA. In an embodiment, for example, the width of the third dummy opening OPD3 along the first direction DR1 may be substantially the same as the width of the first dummy opening OPD1 along the first direction DR1 and the width of the second dummy opening OPD2 along the direction DR1, and the third dummy width W3 of the third dummy opening OPD3 along the second direction DR2 may be greater than the first dummy width W1 of the first dummy opening OPD1 along the second direction DR2.

In an embodiment, the third extent of the third dummy opening OPD3 may be in a range from about 70% to about 130% of the extent of the active opening OPA. When the third extent is less than about 70% of the extent of the active opening OPA, an ink layer filling the third dummy opening OPD3 may overflow to the outside of the third dummy opening OPD3. Further, when the third extent is greater than about 130% of the extent of the active opening OPA, an ink layer filling the third dummy opening OPD3 may not sufficiently fill the third dummy opening OPD3, and thus, impurities may flow into the third dummy opening OPD3. In an embodiment, the third extent of the third dummy opening OPD3 may be about 105% of the extent of the active opening OPA.

The third dummy ink layer 163 may fill the third dummy opening OPD3. Light may not be incident on the third dummy ink layer 163.

In an embodiment, a volume of the active ink layer 150, a volume of the first dummy ink layer 161, a volume of the second dummy ink layer 162, and a volume of the third dummy ink layer 163 may be substantially equal to each other. In an embodiment, for example, when the first extent of the first dummy opening OPD1 is substantially equal to the extent of the active opening OPA, the second extent of the second dummy opening OPD2 is less than the first extent of the first dummy opening OPD1, and the third extent of the third dummy opening OPD3 is greater than the first extent of the first dummy opening OPD1, each of an upper surface of the active ink layer 150 and an upper surface of the first dummy ink layer 161 may be substantially flat, an upper surface of the second dummy ink layer 162 may be convex, and an upper surface of the third dummy ink layer 163 may be concave.

In an embodiment, a material of the active ink layer 150, a material of the first dummy ink layer 161, a material of the second dummy ink layer 162, and a material of the third dummy ink layer 163 may be substantially the same as each other. In an embodiment, for example, each of the active ink layer 150, the first dummy ink layer 161, the second dummy ink layer 162, and the third dummy ink layer 163 may include the first quantum dot and the first scatterer. However, the invention is not limited thereto, and each of the active ink layer 150, the first dummy ink layer 161, the second dummy ink layer 162, and the third dummy ink layer 163 may include the second quantum dots and the second scatterer, or may include the third scatterer.

Figure 8:
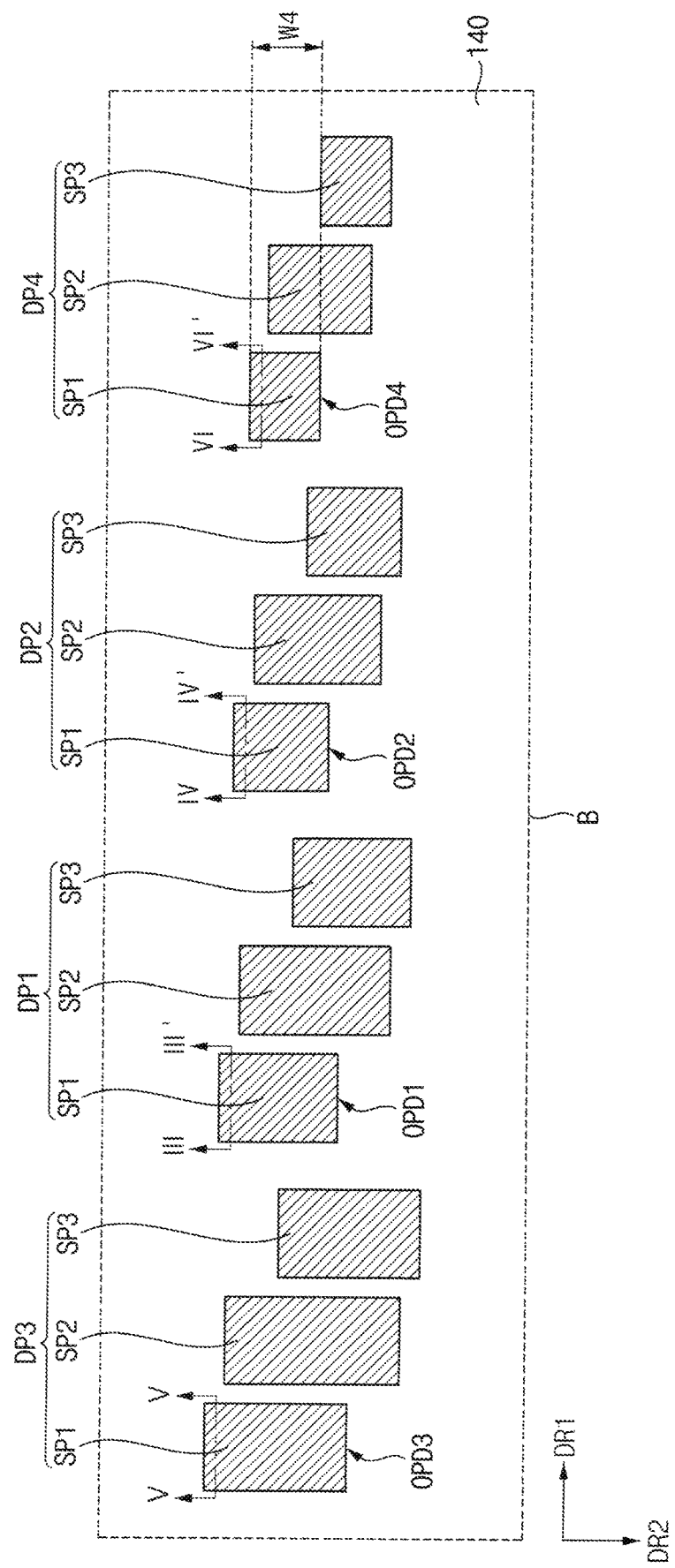
FIG. 8 is an enlarged plan view illustrating an embodiment of area B in FIG. 1.
Figure 9:
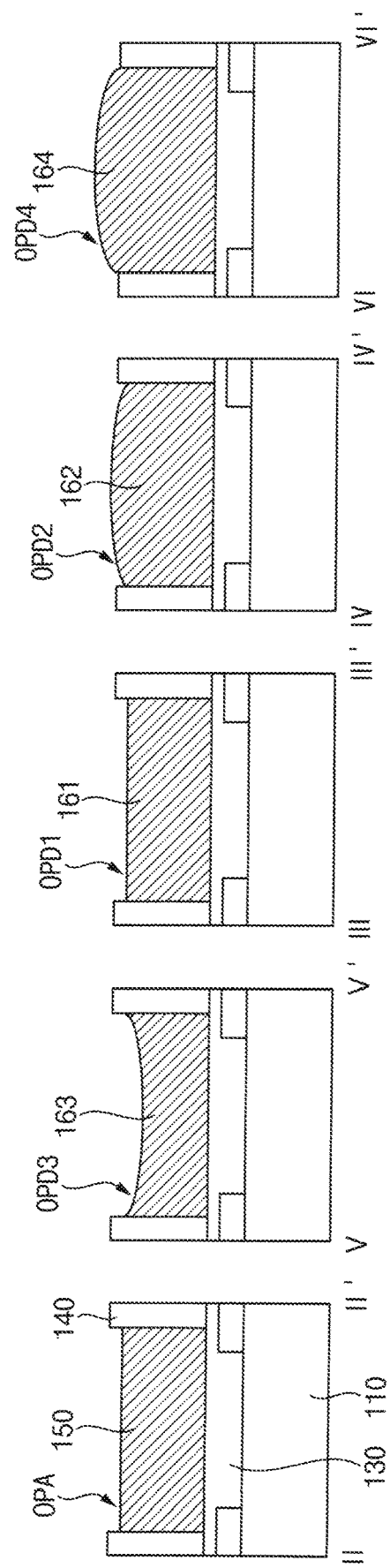
FIG. 9 is a cross-sectional view illustrating the color conversion panel taken along line II-II' in FIG. 2 and lines III-III', IV-IV', V-V', and VI-VI' in FIG. 8.

FIG. 8 is an enlarged plan view illustrating an embodiment of area B in FIG. 1. FIG. 9 is a cross-sectional view illustrating the color conversion panel 100 taken along line II-II' in FIG. 2 and lines III-III', IV-IV', V-V', and VI-VI' in FIG. 8.

The color conversion panel 100 described with reference to FIGS. 1, 2, 8, and 9 may be substantially the same as or similar to the color conversion panel 100 described with reference to FIGS. 1, 2, 6, and 7 except for the addition of a fourth dummy pixel portion DP4. Accordingly, descriptions of repeated elements will be omitted.

Referring to FIGS. 1, 2, 8, and 9, the color conversion panel 100 may further include a fourth dummy ink layer 164.

The dummy area DA may further include a fourth dummy pixel portion DP4 provided in plural including fourth dummy pixel portions DP4. The fourth dummy pixel portions DP4 may be disposed along the first direction DR1 from the second dummy pixel portions DP2, and may be arranged along the second direction DR2. That is, within the dummy area DA, the third dummy pixel portion DP3, the first dummy pixel portion DP1, the second dummy pixel portion DP2 and the fourth dummy pixel portion DP4 may be in order along the first direction DR1 from the active area AA.

The fourth dummy pixel portion DP4 may include a first sub-pixel portion SP1, a second sub-pixel portion SP2, and a third sub-pixel portion SP3. Shapes and arrangements of the first sub-pixel portion SP1, the second sub-pixel portion SP2, and the third sub-pixel portion SP3 of the fourth dummy pixel portion DP4 may be substantially the same as or similar to the shapes and arrangements of the first sub-pixel portion SP1, the second sub-pixel portion SP2, and the third sub-pixel portion SP3 of the active pixel portion AP.

Hereinafter, the active pixel portion AP, the first dummy pixel portion DP1, the second dummy pixel portion DP2, the third dummy pixel portion DP3, and the fourth dummy pixel portion DP4 may mean corresponding sub-pixel portions displaying the same color. In an embodiment, for example, as illustrated in FIGS. 2, 8, and 9, the active pixel portion AP, the first dummy pixel portion DP1, the second dummy pixel portion DP2, and the third dummy pixel portion DP3, and the fourth dummy pixel portion DP4 may mean the first sub-pixel portions SP1. However, the invention is not limited thereto, and the active pixel portion AP, the first dummy pixel portion DP1, the second dummy pixel portion DP2, the third dummy pixel portion DP3, and the fourth dummy pixel portion DP4 may mean the second sub-pixel portions SP2 or the third sub-pixel portions SP3.

The bank 140 may further define a fourth dummy opening OPD4 overlapping or corresponding to the fourth dummy pixel portion DP4. The fourth dummy pixel portion DP4 including the first sub-pixel portion SP1, the second sub-pixel portion SP2, and the third sub-pixel portion SP3 may be defined by one or more of the fourth dummy opening OPD4.

The fourth extent (e.g., fourth planar area) of the fourth dummy opening OPD4 may be different from the first extent of the first dummy opening OPD1, the second extent of the second dummy opening OPD2, and the third extent of the third dummy opening OPD3. In an embodiment, a width of the fourth dummy opening OPD4 along the first direction DR1 may be substantially equal to the width of the first dummy opening OPD1 along the first direction DR1, the width of the second dummy opening OPD2 along the first direction DR1, and the width of the third dummy opening OPD3 along the first direction DR1, and the fourth dummy width W4 of the fourth dummy opening OPD4 along the second direction DR2 may be different from the first dummy width W1 of the first dummy opening OPD1 along the second direction DR2, the second dummy width W2 of the second dummy opening OPD2 along the second direction DR2, and the third dummy width W3 of the third dummy opening OPD3 along the second direction DR2.

In an embodiment, the fourth extent of the fourth dummy opening OPD4 may be less than the second extent of the second dummy opening OPD2. In an embodiment, for example, the width of the fourth dummy opening OPD4 along the first direction DR1 may be substantially equal to the width of the second dummy opening OPD2 along the first direction DR1, and the fourth dummy width W4 of the fourth dummy opening OPD4 along the second direction DR2 may be less than the second dummy width W2 of the second dummy opening OPD2 along the second direction DR2.

In an embodiment, the fourth extent of the fourth dummy opening OPD4 may be in a range from about 70% to about 130% of the extent of the active opening OPA. When the fourth extent is less than about 70% of the extent of the active opening OPA, the ink layer filling the fourth dummy opening OPD4 may overflow to the outside of the fourth dummy opening OPD4. Further, when the fourth extent is greater than about 130% of the extent of the active opening OPA, the ink layer filling the fourth dummy opening OPD4 does not sufficiently fill the fourth dummy opening OPD4, and thus, impurities may flow into the fourth dummy opening OPD4. In an embodiment, the fourth extent of the fourth dummy opening OPD4 may be about 90% of the extent of the active opening OPA.

The fourth dummy ink layer 164 may fill the fourth dummy opening OPD4. Light may not be incident on the fourth dummy ink layer 164.

In an embodiment, a volume of the active ink layer 150, a volume of the first dummy ink layer 161, a volume of the second dummy ink layer 162, a volume of the third dummy ink layer 163, and a volume of the fourth dummy ink layer 164 may be substantially equal to each other. In an embodiment, for example, when the first extent of the first dummy opening OPD1 is substantially equal to the extent of the active opening OPA, the second extent of the second dummy opening OPD2 is less than the first extent of the first dummy opening OPD1, the third extent of the third dummy opening OPD3 is greater than the first extent of the first dummy opening OPD1, and the fourth extent of the fourth dummy opening OPD4 is less than the second extent of the second dummy opening OPD2, each of an upper surface of the active ink layer 150 and an upper surface of the first dummy ink layer 161 may be substantially flat, each of an upper surface of the second dummy ink layer 162 and an upper surface of the fourth dummy ink layer 164 may be convex, and an upper surface of the third dummy ink layer 163 may be concave. Further, the upper surface of the fourth dummy ink layer 164 may be more convex than the upper surface of the second dummy ink layer 162. The fourth dummy ink layer 164 may extend to outside the fourth dummy opening OPD4.

In an embodiment, a material of the active ink layer 150, a material of the first dummy ink layer 161, a material of the second dummy ink layer 162, a material of the third dummy ink layer 163, and a material of the fourth dummy ink layer 164 may be substantially the same as each other. In an embodiment, for example, each of the active ink layer 150, the first dummy ink layer 161, the second dummy ink layer 162, the third dummy ink layer 163, and the fourth dummy ink layer 164 may include the first quantum dot and the first scatterer. However, the invention is not limited thereto, and each of the active ink layer 150, the first dummy ink layer 161, the second dummy ink layer 162, the third dummy ink layer 163, and the fourth dummy ink layer 164 may include the second quantum dot and the second scatterer, or may include the third scatterer.

FIGS. 10, 11, 12, 13, 14, 15, and 16 are diagrams illustrating an embodiment of a method of measuring volume of an ink layer of a color conversion panel 100.

The method of measuring the volume of the ink layer of the color conversion panel 100 described with reference to FIGS. 10 to 16 may illustrate a method of measuring a volume of each of the ink layers 150, 161, 162, 163, and 164 of the color conversion layer within the color conversion panel 100 described with reference to FIGS. 1, 2, 8, and 9. However, the invention is not limited thereto, and the method of measuring the volume of the ink layer of the color conversion panel 100 described with reference to FIGS. 10 to 16 may be applied to the color conversion panel 100 described with reference to FIGS. 1, 2, 4, and 5 and the color conversion panel 100 described with reference to FIGS. 1, 2, 6, and 7.

Figure 10:
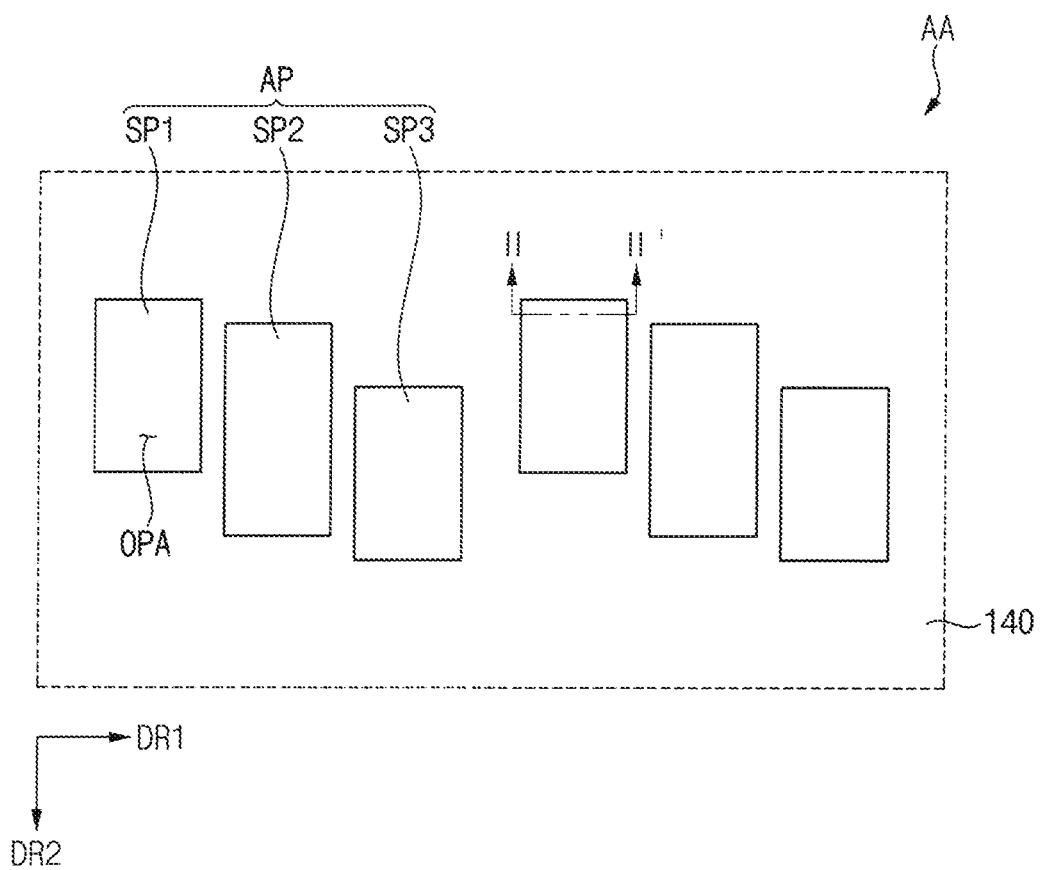
FIGS. 10, 11, 12, 13, 14, 15, and 16 are diagrams illustrating an embodiment of a method of measuring volume of an ink layer of a color conversion panel.
Figure 11:
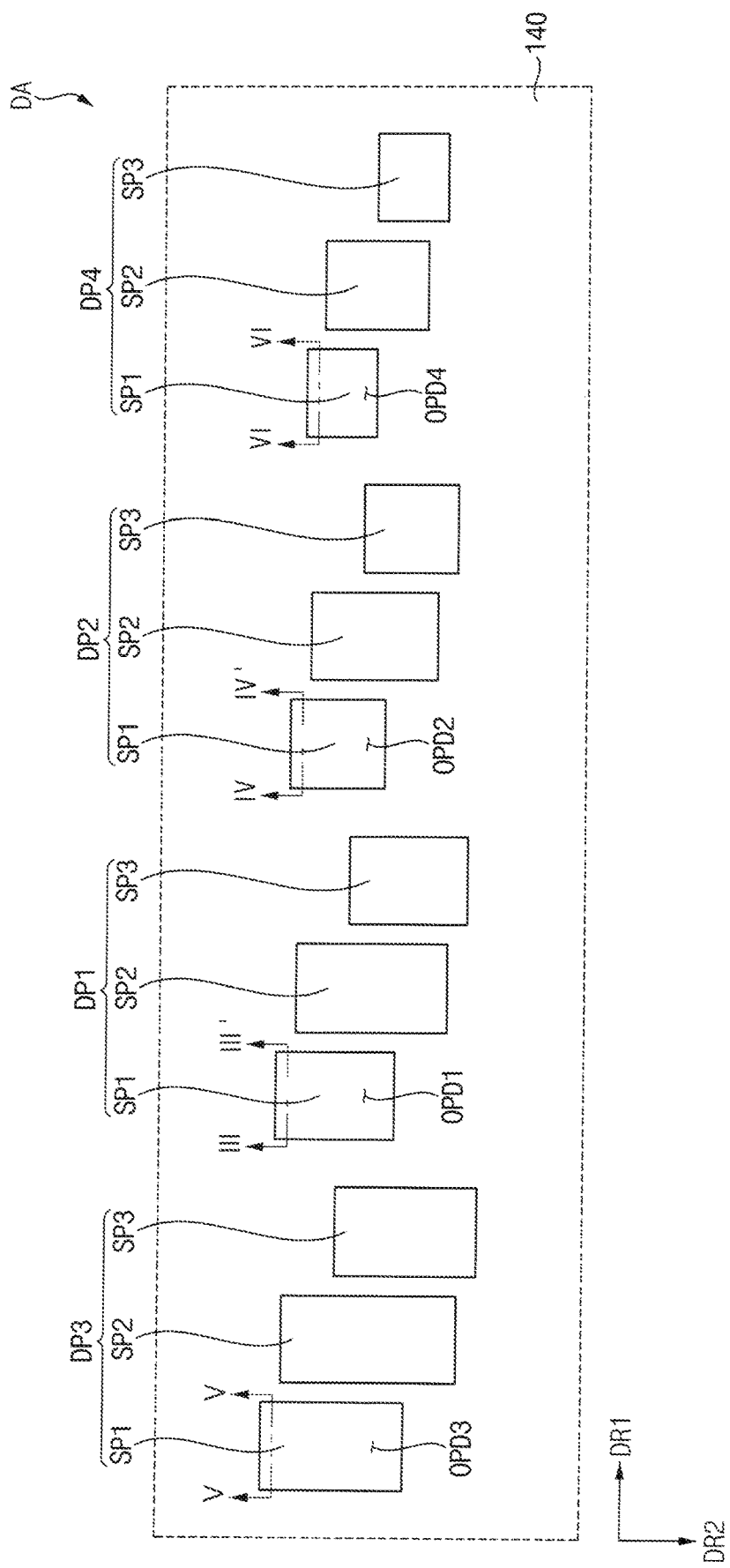
Figure 12:
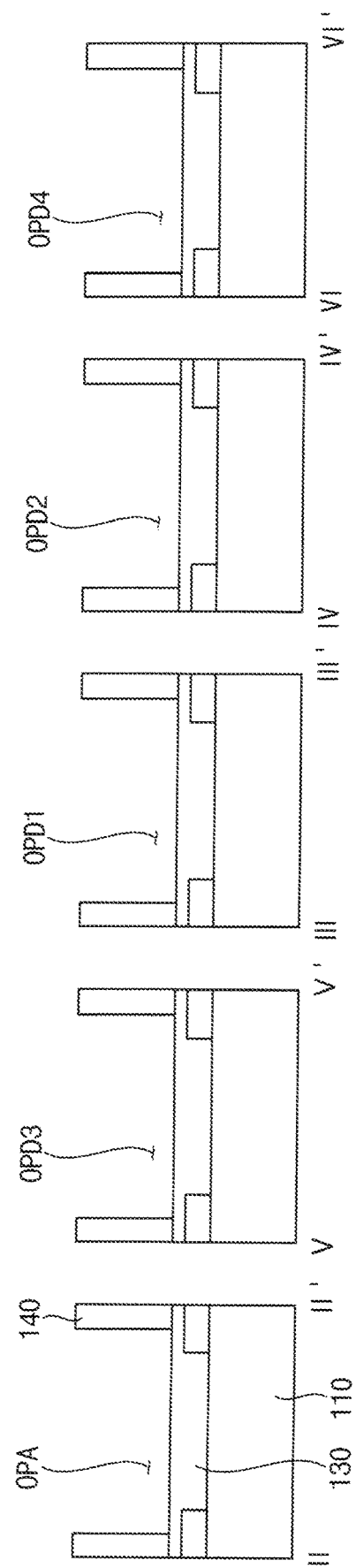

FIG. 10 is an enlarged plan view illustrating the active area AA of the color conversion panel 100 before providing or forming the ink layer (e.g., preliminary active area in a preliminary color conversion panel), FIG. 11 is an enlarged plan view illustrating the dummy area DA of the color conversion panel 100 before forming the ink layer (e.g., preliminary dummy area in preliminary color conversion panel), and FIG. 12 is a cross-sectional view illustrating the preliminary color conversion panel taken along line II-II' in FIG. 10 and lines III-III', IV-IV', V-V', and VI-VI' in FIG. 11.

Referring to FIGS. 10, 11, and 12, the preliminary color conversion panel including the substrate 110, the black matrix 120 (refer to FIG. 3), the color filter layer 130, and the bank 140 may be provided. That is, the method may include providing a color conversion layer of the color conversion panel 100 where the color conversion layer includes a bank layer (e.g., the bank 140). The bank 140 may define the active opening OPA overlapping the active pixel portion AP, the first dummy opening OPD1 overlapping the first dummy pixel portion DP1, the second dummy opening OPD2 overlapping the second dummy pixel portion DP2, the third dummy opening OPD3 overlapping the third dummy pixel portion DP3, and the fourth dummy opening OPD4 overlapping the fourth dummy pixel portion DP4.

The first extent of the first dummy opening OPD1, the second extent of the second dummy opening OPD2, the third extent of the third dummy opening OPD3, and the fourth extent of the fourth dummy opening OPD4 may be different from each other. That is, for corresponding sub-pixel portions, the first extent of the first dummy opening OPD1, the second extent of the second dummy opening OPD2, the third extent of the third dummy opening OPD3, and the fourth extent of the fourth dummy opening OPD4 may be different from each other. The first extent of the first dummy opening OPD1 may be substantially equal to the extent of the active opening OPA.

Figure 13:
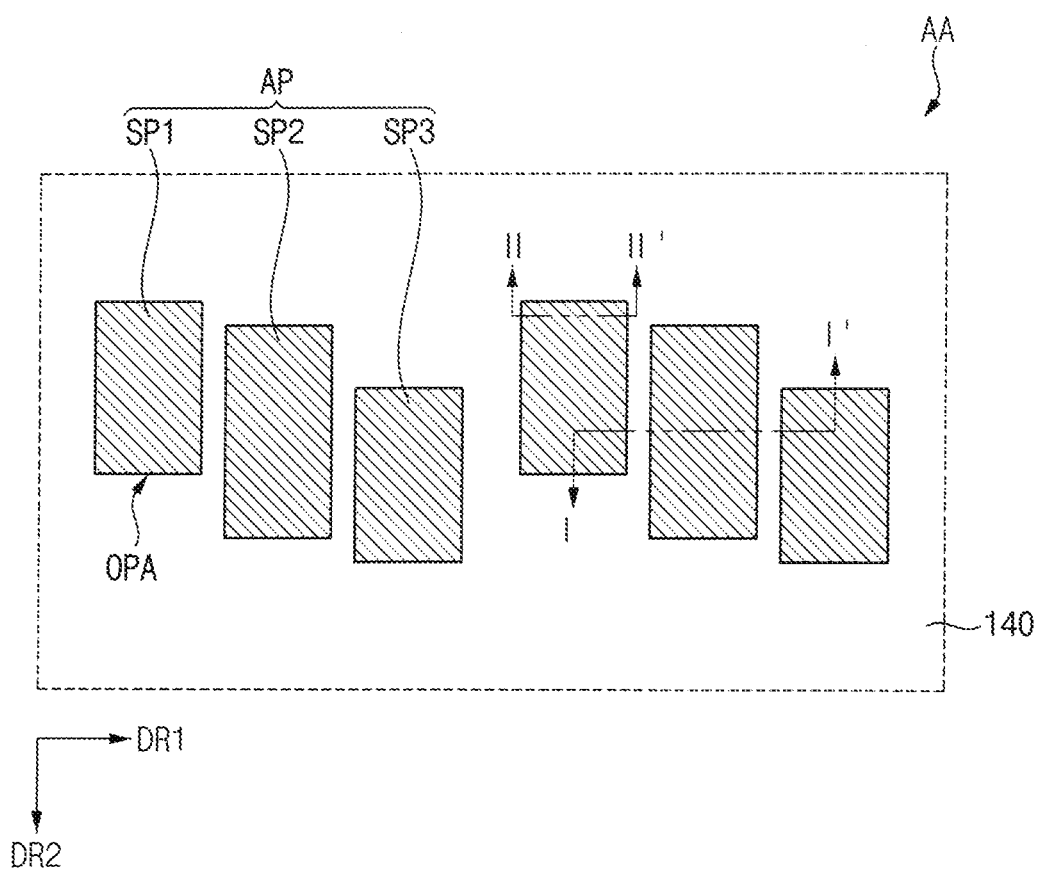
Figure 14:
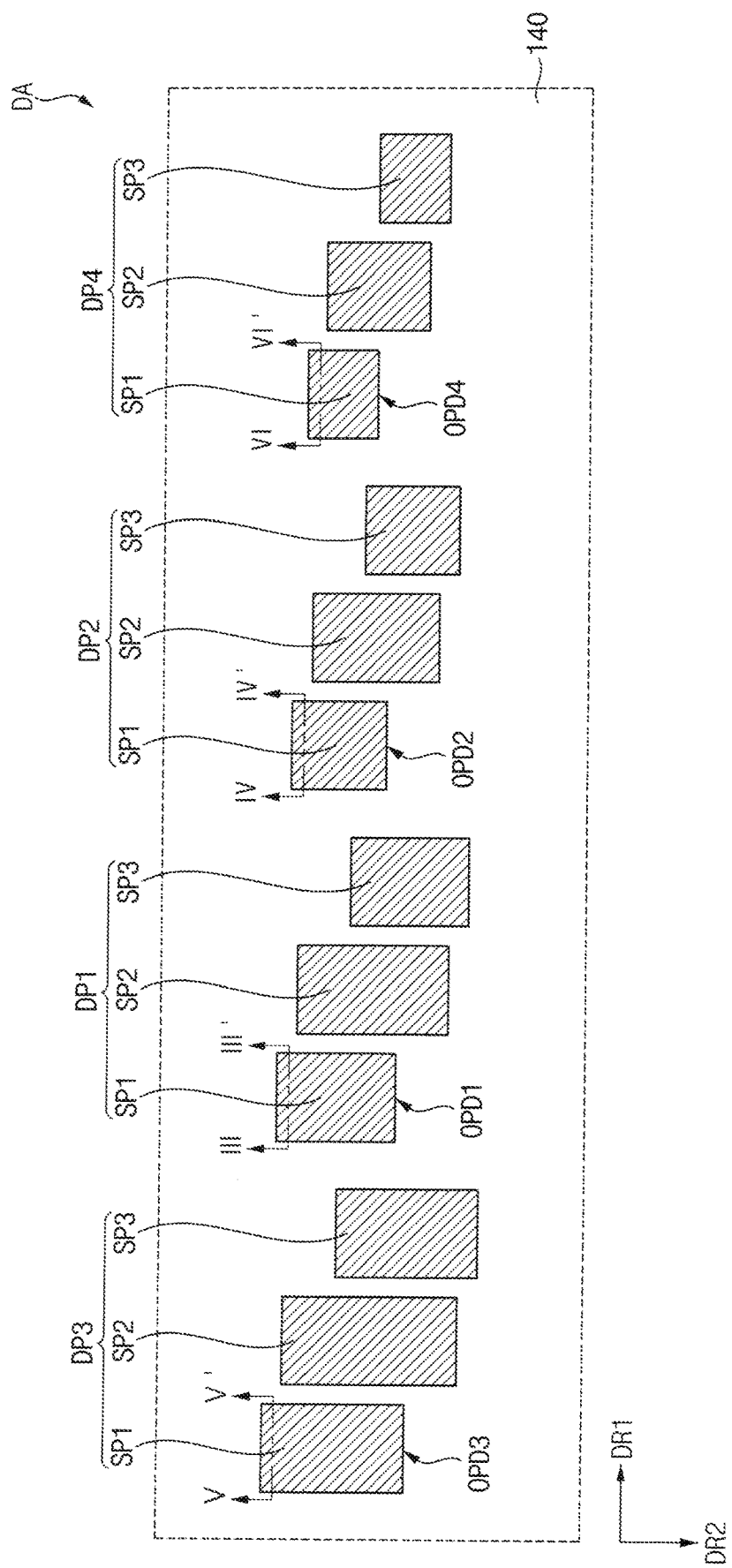
Figure 15:
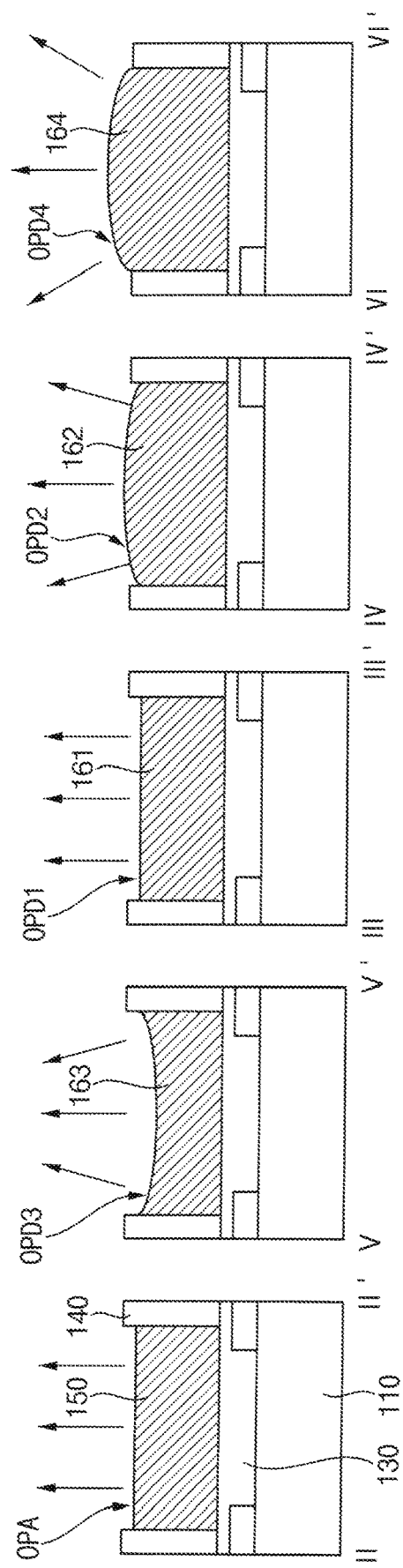

FIG. 13 is an enlarged plan view illustrating the active area AA of the color conversion panel 100 after providing or forming ink layers 150, 161, 162, 163, and 164, FIG. 14 is an enlarged plan view illustrating the dummy area DA of the color conversion panel 100 after providing or forming ink layers 150, 161, 162, 163, and 164, and FIG. 15 is a cross-sectional view illustrating the color conversion panel 100 taken along line II-II' in FIG. 13 and lines III-III', V-V', and VI-VI' in FIG. 14.

Referring to FIGS. 13, 14, and 15, substantially equal amount of ink may be injected into each of the active opening OPA, the first dummy opening OPD1, the second dummy opening OPD2, the third dummy opening OPD3, and the fourth dummy opening OPD4 to form the active ink layer 150, the first dummy ink layer 161, the second dummy ink layer 162, the third dummy ink layer 163, and the fourth dummy ink layer 164. That is, each of the active ink layer 150, the first dummy ink layer 161, the second dummy ink layer 162, the third dummy ink layer 163 and the fourth dummy ink layer 164 defines a volume in the active opening OPA, the first dummy opening OPD1, the second dummy opening OPD2, the third dummy opening OPD3, and the fourth dummy opening OPD4, respectively. Accordingly, the volume of the active ink layer 150, the volume of the first dummy ink layer 161, the volume of the second dummy ink layer 162, the volume of the third dummy ink layer 163, and the volume of the fourth dummy ink layer 164 may be substantially equal to each other.

In an embodiment, the ink may be injected by an inkjet printing using an inkjet device. The ink may be injected into the openings OPA, OPD1, OPD2, OPD3, and OPD4 through a head of the inkjet device.

Figure 16:
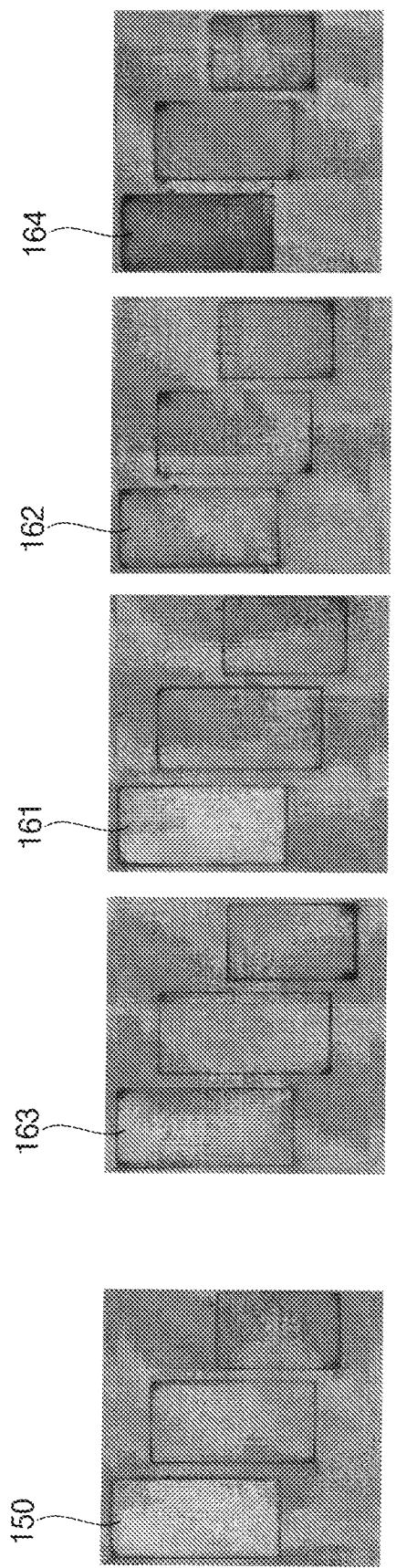

FIG. 16 is a diagram illustrating an image with respect to the ink layers 150, 161, 162, 163, and 164 of the color conversion panel 100 in the openings OPA, OPD1, OPD2, OPD3, and OPD4, respectively.

In an embodiment, the volume of the active ink layer 150, the volume of the first dummy ink layer 161, the volume of the second dummy ink layer 162, the volume of the third dummy ink layer 163 and the volume of the fourth dummy ink layer 164 are equal to each other and together with the active opening planar area of the active opening OPA, the first planar area of the first dummy opening OPD1, the second planar area of the second dummy opening OPD2, the third planar area of the third dummy opening OPD3 and the fourth planar area of the fourth dummy opening OPD4, define a brightness at the active ink layer 150, the first dummy ink layer 161, the second dummy ink layer 162, the third dummy ink layer 163 and the fourth dummy ink layer 164, respectively.

Referring to FIGS. 15 and 16, the color conversion panel 100 in which the ink layers 150, 161, 162, 163, and 164 are provided or formed may be captured to collect an image with respect to the active ink layer 150, the first dummy ink layer 161, the second dummy ink layer 162, the third dummy ink layer 163, and the fourth dummy ink layer 164. In an embodiment, the ink layers 150, 161, 162, 163, and 164 may be captured using a camera of the inkjet device positioned above the color conversion panel 100. That is, the method includes providing of the image of the color conversion panel 100 which has the brightness at the active ink layer 150, the first dummy ink layer 161, the second dummy ink layer 162, the third dummy ink layer 163 and the fourth dummy ink layer 164.

Then, a brightness of the active ink layer 150 of the image, a brightness of the first dummy ink layer 161 of the image, a brightness of the second dummy ink layer 162 of the image, a brightness of the third dummy ink layer 163 of the image, and a brightness of the fourth dummy ink layer 164 of the image may be compared. That is, the method includes providing a comparison of the brightness of the active ink layer 150, the brightness of the first dummy ink layer 161, the brightness of the second dummy ink layer 162, the brightness of the third dummy ink layer 163 and the brightness of the fourth dummy ink layer 164 of the image to measure the volume of the ink layer. Referring to FIG. 16, the brightness of the active ink layer 150 of the image may be substantially the same as the brightness of the first dummy ink layer 161 of the image. The brightness of the first dummy ink layer 161 of the image, the brightness of the second dummy ink layer 162 of the image, the brightness of the third dummy ink layer 163 of the image, and the brightness of the fourth dummy ink layer 164 of the image may be different from each other.

In an embodiment, as illustrated in FIG. 16, the brightness of the active ink layer 150 of the image may be substantially the same as the brightness of the first dummy ink layer 161 of the image, each of the brightness of the second dummy ink layer 162 of the image and the brightness of the third dummy ink layer 163 of the image may be less than the brightness of the first dummy ink layer 161 of the image, and the brightness of the fourth dummy ink layer 164 of the image may be less than the brightness of the second dummy ink layer 162 of the image. Since the upper surface of each of the active ink layer 150 and the first dummy ink layer 161 is substantially flat, the brightness of light reflected from the upper surface of each of the active ink layer 150 and the first dummy ink layer 161 toward above the color conversion panel 100 (e.g., in a direction away from the substrate 110) may be relatively large.

Since the upper surface of the second dummy ink layer 162 is convex and the upper surface of the third dummy ink layer 163 is concave, the brightness of light reflected from the upper surface of each of the second dummy ink layer 162 and the third dummy ink layer 163 toward above the color conversion panel 100 may be less than the brightness of light reflected from the upper surface of each of the active ink layer 150 and the first dummy ink layer 161 toward above the color conversion panel 100.

Since the upper surface of the fourth dummy ink layer 164 is more convex than the upper surface of the second dummy ink layer 162, the brightness of light reflected from the upper surface of the fourth dummy ink layer 164 toward above the color conversion panel 100 may be less than the brightness of light reflected from the upper surface of the second dummy ink layer 162 toward above the color conversion panel 100. In this case, the brightness of the first dummy ink layer 161 of the image, the brightness of the second dummy ink layer 162 of the image, the brightness of the third dummy ink layer 163 of the image, and the brightness of the fourth dummy ink layer 164 of the image is compared to determine that the brightness of the first dummy ink layer 161 of the image is the largest, and thus, the volume of the active ink layer 150 filling the active opening OPA that has the extent substantially equal to the first extent of the first dummy opening OPD1 is accurate within a range.

According to one or more embodiment of the method of measuring the volume of the ink layer of the color conversion panel 100, the ink layers 161, 162, 163, and 164 in the dummy area DA having substantially equal volume may be provided or formed in the dummy openings OPD1, OPD2, OPD3, and OPD4 having different extents from each other, and the color conversion panel 100 may be captured to collect the image of the ink layers 161, 162, 163, 164. Since the first extent of the first dummy opening OPD1 may be substantially equal to the extent of the active opening OPA, the brightness of the ink layers 150, 161, 162, 163, and 164 of the image may be compared, so that the volumes of the ink layers 150, 161, 162, 163, and 164 of the color conversion panel 100 may be quickly and accurately measured.

Figure 17:
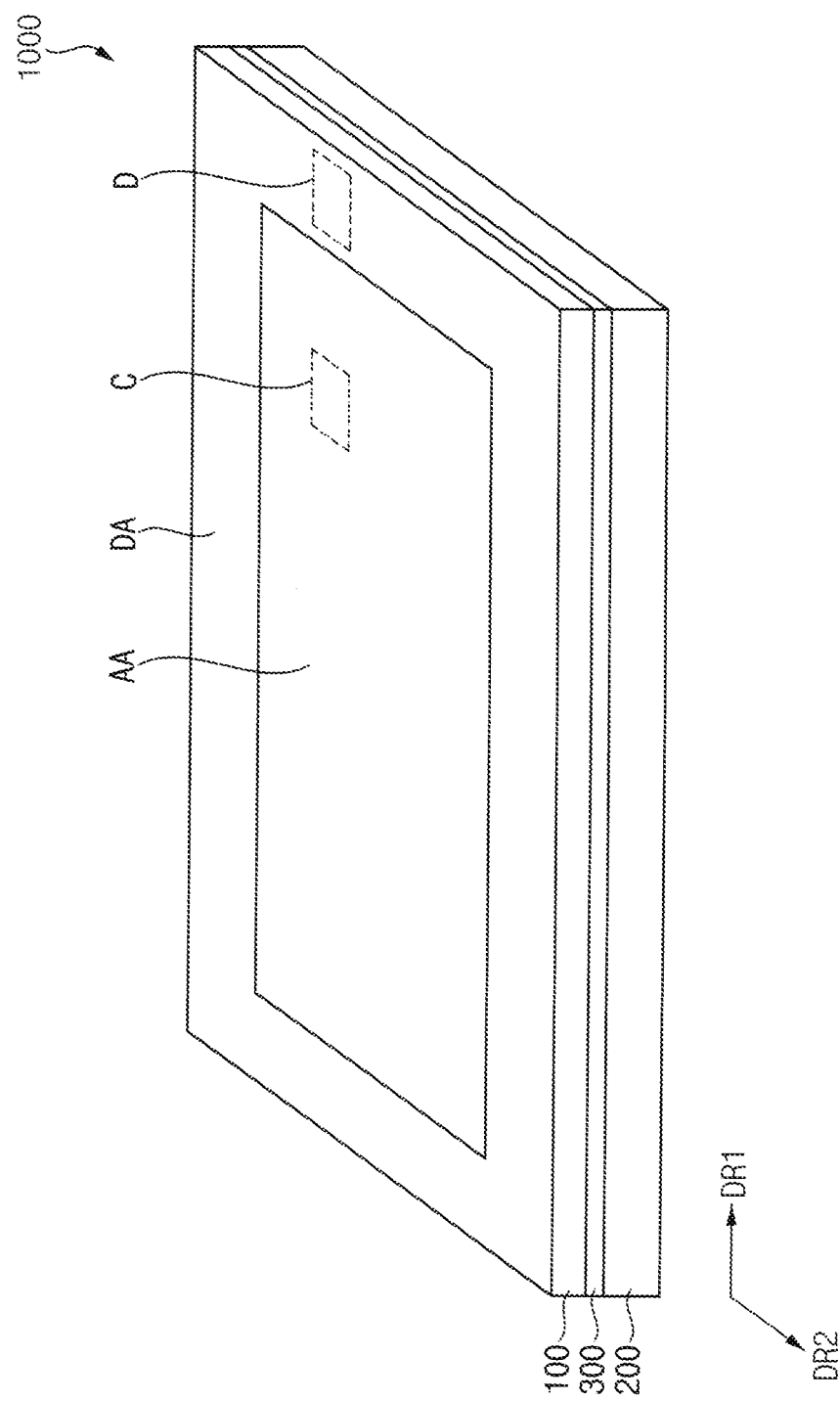
FIG. 17 is a perspective view illustrating an embodiment of a display device.
Figure 18:
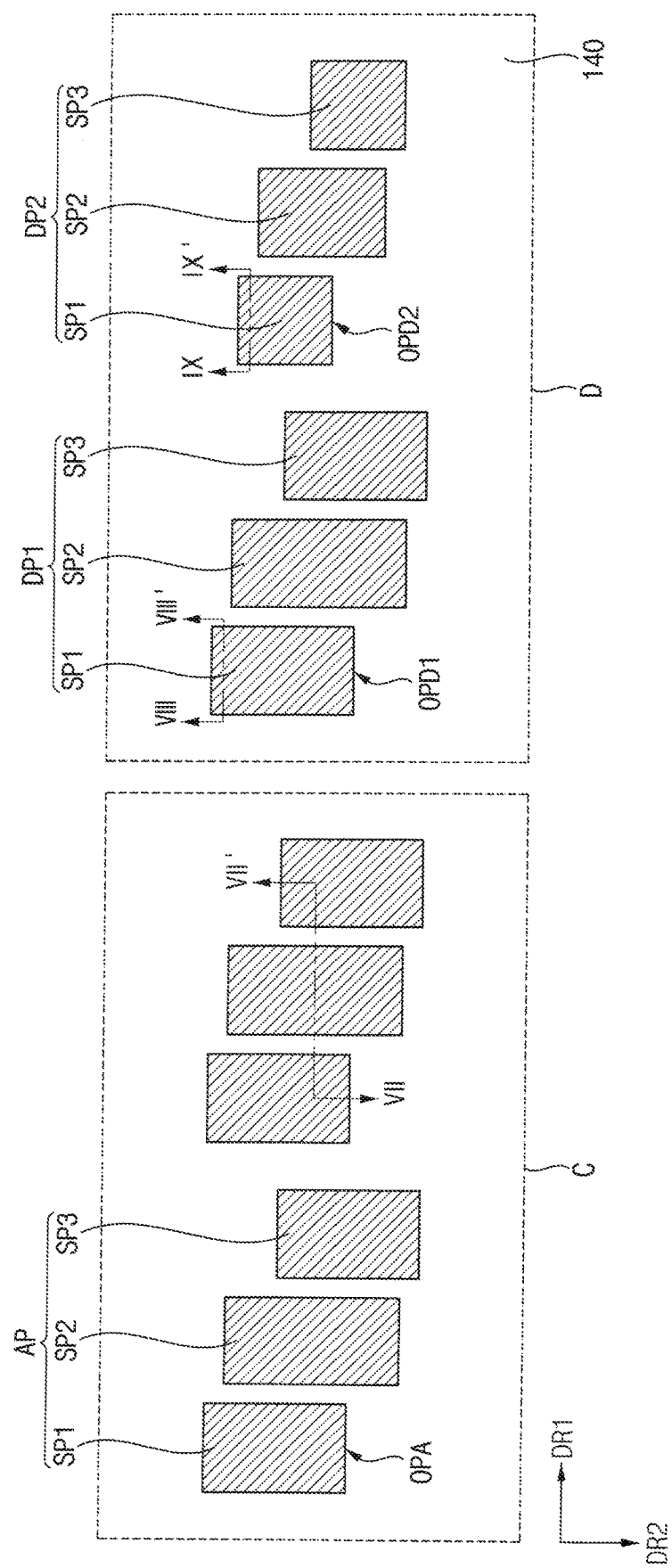
FIG. 18 is an enlarged plan view illustrating an embodiment of areas C and D in FIG. 17.
Figure 19:
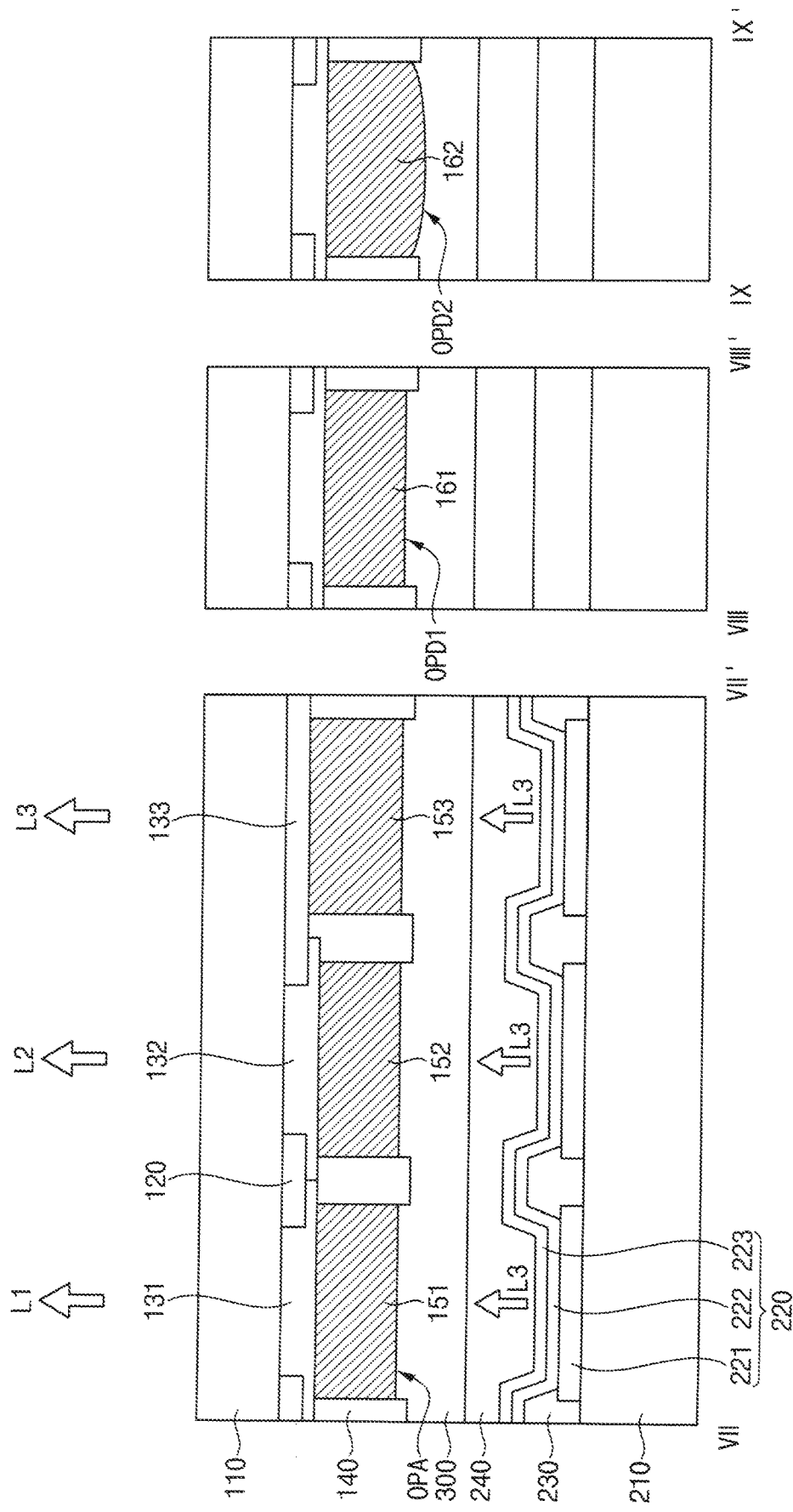
FIG. 19 is a cross-sectional view illustrating an embodiment of the display device taken along lines VII-VII', VIII-VIII', and IX-IX' in FIG. 18.

FIG. 17 is a perspective view illustrating an embodiment of a display device 1000. FIG. 18 is an enlarged plan view illustrating an embodiment of areas C and D in FIG. 17. FIG. 19 is a cross-sectional view illustrating the display device 1000 taken along lines VII-VII', VIII-VIII', and IX-IX' in FIG. 18.

Referring to FIGS. 17, 18, and 19, the display device 1000 may include a color conversion panel 100, a display panel 200, and a filling layer 300. The display device 1000 and various layers and components thereof may include an active area AA and a dummy area DA corresponding to those described above for the color conversion panel 100.

The color conversion panel 100 may convert or transmit light provided from the display panel 200. The color conversion panel 100 described with reference to FIGS. 17 to 19 may be substantially the same as or similar to the color conversion panel 100 described with reference to FIGS. 1 to 9. Accordingly, descriptions of repeated elements will be omitted.

The display panel 200 may generate and/or provide light to the active area AA of the color conversion panel 100. The display panel 200 may provide the third light L3 to the color conversion panel 100, and the color conversion panel 100 may convert the third light L3 into the first light L1 and/or the second light L2, or may transmit the third light L3.

The display panel 200 may include a display substrate 210, a light emitting element 220 provided in plural including light emitting elements 220, a pixel defining layer 230, and an encapsulation layer 240. The display substrate 210 may include a base substrate and transistors and capacitors which are disposed on the base substrate.

The light emitting elements 220 may be disposed on the display substrate 210. The light emitting elements 220 may respectively overlap the active pixel portions AP of the active area AA of the color conversion panel 100.

The light emitting element 220 may include a first electrode 221, an emission layer 222 disposed on the first electrode 221, and a second electrode 223 disposed on the emission layer 222. In an embodiment, the first electrode 221 may be individually provided or formed for each light emitting element 220 (e.g., a pattern), and the emission layer 222 and the second electrode 223 may be commonly provided or formed for the light emitting elements 220. The light emitting element 220 may emit the third light L3 generated from the emission layer 222 based on an electric field between the first electrode 221 and the second electrode 223.

The pixel defining layer 230 may cover an edge of the first electrode 221 on the display substrate 210. The pixel defining layer 230 may separate the light emitting elements 220 from each other.

The encapsulation layer 240 may be disposed on the second electrode 223. The encapsulation layer 240 may block impurities from flowing into the light emitting element 220 from outside thereof. The encapsulation layer 240 may include at least one inorganic encapsulation layer and at least one organic encapsulation layer disposed facing each other.

The filling layer 300 may be disposed between the color conversion panel 100 and the display panel 200. The display device 1000 may include the color conversion panel 100 which faces the display panel 200 with the filling layer 300 therebetween. Specifically, the ink layers 151, 152, 153, 161, and 162 of the color conversion panel 100 may face the encapsulation layer 240 of the display panel 200 with the filling layer 300 interposed therebetween. That is, various opening defined by the bank 140 may be open to outside the color conversion panel 100, such that various ink layers may be exposed to outside the color conversion panel 100.

The filling layer 300 may fill a space between the color conversion panel 100 and the display panel 200, and the color conversion panel 100 and the display panel 200 may be combined by the filling layer 300. The filling layer 300 may contact the color conversion panel 100, such as at the various ink layers and the bank 140 which are exposed to outside the color conversion panel 100. As being in contact, elements may form an interface therebetween.

As described above, when the extents of the dummy openings OPD1 and OPD2 are in a range from about 70% to about 130% of the extent of the active opening OPA, the color conversion panel 100 and the display panel 200 may be hermetically combined by the filling layer 300. The ink layers 161 and 162 filling the dummy openings OPD1 and OPD2 may overflow to the outside of the dummy openings OPD1 and OPD2 when the extents of the dummy openings OPD1 and OPD2 are less than about 70% of the extent of the active opening OPA, and the ink layers 161 and 162 filling the dummy openings OPD1 and OPD2 may not sufficiently fill the dummy openings OPD1 and OPD2 when the extents of the dummy openings OPD1 and OPD2 are greater than about 130% of the extent of the active opening OPA. Accordingly, when the extents of the dummy openings OPD1 and OPD2 are less than about 70% or greater than about 130% of the extent of the active opening OPA, bonding force between the color conversion panel 100 and the display panel 200 may decrease in the process of combining the color conversion panel 100 and the display panel 200 with the filling layer 300 interposed therebetween.

One or more embodiment of the color conversion panel 100 and the display device 1000 may be applied to a computer, a notebook, a mobile phone, a smartphone, a smart pad, a personal media player ("PMP"), a personal digital assistant ("PDA"), an MP3 player, or the like.

Although embodiments of color conversion panels, methods of measuring volume of the ink layer of the color conversion panels, and display devices including the color conversion panels have been described with reference to the drawings, the embodiments are examples, and may be modified and changed by a person having ordinary knowledge in the relevant technical field without departing from the technical spirit described in the following claims.

What is claimed is:

1. A color conversion panel, comprising:
  an active area corresponding to a display area of a display device and including an active pixel portion at which light is emitted;
  a dummy area adjacent to the active area and including a first dummy pixel portion and a second dummy pixel portion; and
  a color conversion layer including:
    a bank layer in both the active area and the dummy area, the bank layer defining each of:
      an active opening corresponding to the active pixel portion and defining an active opening planar area,
      a first dummy opening corresponding to the first dummy pixel portion and defining a first planar area, and
      a second dummy opening corresponding to the second dummy pixel portion and defining a second planar area different from the first planar area of the first dummy opening, and
    an ink layer comprising an active ink layer, a first dummy ink layer and a second dummy ink layer respectively in the active opening, the first dummy opening and the second dummy opening, each of the active ink layer, the first dummy ink layer and the second dummy ink layer defines an upper surface having a shape in cross-section,
  wherein
    a volume of the first dummy ink layer and a volume of the second dummy ink layer are the same as each other together with the shape of the upper surface of the first dummy ink layer being different from the shape of the upper surface of the second dummy ink layer.

2. The color conversion panel of claim 1, wherein the first planar area of the first dummy opening in the dummy area is equal to the active opening planar area of the active opening in the active area.

3. The color conversion panel of claim 2, wherein within the dummy area, the second planar area of the second dummy opening is less than the first planar area of the first dummy opening.

4. The color conversion panel of claim 2, wherein within the dummy area, the second planar area of the second dummy opening is greater than the first planar area of the first dummy opening.

5. The color conversion panel of claim 1, wherein each of the first planar area of the first dummy opening and the second planar area of the second dummy opening is in a range from about 70% to about 130% of the active opening planar area of the active opening.

6. The color conversion panel of claim 1, wherein
  a volume of the active ink layer is equal to the volume of the first dummy ink layer and the volume of the second dummy ink layer, and
  the shape of the upper surface of the active ink layer is the same as the shape of the upper surface of the first dummy ink layer.

7. The color conversion panel of claim 6, wherein
  the active pixel portion emits the light having a color,
  each of the active ink layer, the first dummy ink layer and the second dummy ink layer of the ink layer has a material corresponding to the light which has the color, and
  the material of the active ink layer, the material of the first dummy ink layer and the material of the second dummy ink layer are the same as each other.

8. The color conversion panel of claim 1, wherein
  the dummy area is adjacent to the active area along a first direction, and
  the active pixel portion, the first dummy pixel portion and the second dummy pixel portion are in order along the first direction.

9. The color conversion panel of claim 1, wherein
  the dummy area is adjacent to the active area along a first direction,
  each of the active opening, the first dummy opening and the second dummy opening has a width along the first direction and a width along a second direction which crosses the first direction,
  the width of the first dummy opening along the first direction is equal to the width of the second dummy opening along the first direction, and
  the width of the first dummy opening along the second direction is different from the width of the second dummy opening along the second direction.

10. The color conversion panel of claim 1, wherein
  the dummy area is adjacent to the active area along a first direction, the dummy area further includes a third dummy pixel portion, the first dummy pixel portion and the second dummy pixel portion in order along the first direction, the bank layer further defines a third dummy opening corresponding to the third dummy pixel portion and defining a third planar area which is different from the first planar area of the first dummy opening and the second planar area of the second dummy opening, the ink layer further comprises a third dummy ink layer which is in the third dummy opening and defines an upper surface having a shape in cross-section, a volume of the third dummy ink layer and the volume of the first dummy ink layer are the same as each other, and the shape of the upper surface of the third dummy ink layer is different from each of the shape of the upper surface of the first dummy ink layer and the shape of the upper surface of the second dummy ink layer.

11. The color conversion panel of claim 10, wherein the first planar area of the first dummy opening in the dummy area is equal to the active opening planar area of the active opening in the active area.

12. The color conversion panel of claim 11, wherein within the dummy area:
the second planar area of the second dummy opening is less than the first planar area of the first dummy opening, and
the third planar opening of the third dummy opening is greater than the first planar area of the first dummy opening.

13. The color conversion panel of claim 10, wherein each of the first planar area of the first dummy opening, the second planar area of the second dummy opening and the third planar area of the third dummy opening is in a range from about 70% to about 130% of the active opening planar area of the active opening.

14. The color conversion panel of claim 10, wherein
the dummy area is adjacent to the active area along a first direction,
the dummy area further includes the third dummy pixel portion, the first dummy pixel portion, the second dummy pixel portion and a fourth dummy pixel portion in order along the first direction,
the bank layer further defines a fourth dummy opening corresponding to the fourth dummy pixel portion and defining a fourth planar area which is different from the first planar area of the first dummy opening, the second planar area of the second dummy opening and the third planar opening of the third dummy opening,
the ink layer further comprises a fourth dummy ink layer which is in the fourth dummy opening and defines an upper surface having a shape in cross-section,
a volume of the fourth dummy ink layer and the volume of the first dummy ink layer are the same as each other, and
the shape of the upper surface of the fourth dummy ink layer is different from each of the shape of the upper surface of the first dummy ink layer, the shape of the upper surface of the second dummy ink layer and the shape of the upper surface of the third dummy ink layer.

15. A display device, comprising:
a display panel which provides light at a display area of the display device; and
a color conversion panel which faces the display panel and includes:
an active area corresponding to the display area and including an active pixel portion at which light is emitted,
a dummy area adjacent to the active area and including a first dummy pixel portion and a second dummy pixel portion, and
a color conversion layer including:
a bank layer in both the active area and the dummy area, the bank layer defining each of:
an active opening corresponding to the active pixel portion and defining an active opening planar area,
a first dummy opening corresponding to the first dummy pixel portion and defining a first planar area, and
a second dummy opening corresponding to the second dummy pixel portion and defining a second planar area different from the first planar area of the first dummy opening, and
an ink layer comprising an active ink layer, a first dummy ink layer and a second dummy ink layer respectively in the active opening, the first dummy opening and the second dummy opening, each of the active ink layer, the first dummy ink layer and the second dummy ink layer defines an upper surface having a shape in cross-section,
wherein
a volume of the first dummy ink layer and a volume of the second dummy ink layer are the same as each other together with the shape of the upper surface of the first dummy ink layer being different from the shape of the upper surface of the second dummy ink layer.

16. The display device of claim 15, wherein the display panel includes a light emitting element which provides the light and corresponds to the active pixel portion of the color conversion panel.

17. The display device of claim 15, wherein each of the first planar area of the first dummy opening and the second planar area of the second dummy opening is in a range from about 70% to about 130% of the active opening planar area of the active opening.

18. A color conversion panel, comprising:
an active area corresponding to a display area of a display device and including an active pixel portion at which light is emitted;
a dummy area adjacent to the active area and including a first dummy pixel portion and a second dummy pixel portion; and
a color conversion layer including:
a bank layer in both the active area and the dummy area, the bank layer defining each of:
an active opening corresponding to the active pixel portion and defining an active opening planar area,
a first dummy opening corresponding to the first dummy pixel portion and defining a first planar area, and
a second dummy opening corresponding to the second dummy pixel portion and defining a second planar area different from the first planar area of the first dummy opening, and
an ink layer comprising an active ink layer, a first dummy ink layer and a second dummy ink layer respectively in the active opening, the first dummy opening and the second dummy opening, each of the active ink layer, the first dummy ink layer and the second dummy ink layer defines an upper surface having a shape in cross-section among flat, concave and convex shapes,
wherein
a volume of the first dummy ink layer and a volume of the second dummy ink layer are the same as each other, and
the shape of the upper surface of the first dummy ink layer being different from the shape of the upper surface of the second dummy ink layer.

* * * * *